(12) United States Patent
Sasaki et al.

(10) Patent No.: US 7,660,042 B2
(45) Date of Patent: Feb. 9, 2010

(54) APPARATUS FOR CRYSTALLIZING SEMICONDUCTOR WITH LASER BEAMS

(75) Inventors: Nobuo Sasaki, Kawasaki (JP); Koichi Ohki, Mitaka (JP)

(73) Assignees: Sharp Kabushiki Kaisha, Osaka (JP); Japan Laser Corporation, Tokyo (JP)

( * ) Notice: Subject to any disclaimer, the term of this patent is extended or adjusted under 35 U.S.C. 154(b) by 534 days.

(21) Appl. No.: 11/148,050

(22) Filed: Jun. 8, 2005

(65) Prior Publication Data

US 2005/0225771 A1    Oct. 13, 2005

Related U.S. Application Data

(62) Division of application No. 10/436,673, filed on May 13, 2003, now Pat. No. 6,977,775.

(30) Foreign Application Priority Data

| May 17, 2002 | (JP) | ............................. 2002-143032 |
| May 17, 2002 | (JP) | ............................. 2002-143070 |
| May 17, 2002 | (JP) | ............................. 2002-143097 |

(51) Int. Cl.
*H01L 31/0232* (2006.01)
(52) U.S. Cl. ...................... 359/626; 359/638; 29/25.01; 250/492.22; 250/492.23
(58) Field of Classification Search ................. 359/626, 359/638; 29/25.01; 250/492.22, 492.23
See application file for complete search history.

(56) References Cited

U.S. PATENT DOCUMENTS

| 3,887,906 | A | 6/1975 | Minnaja |
| 4,511,220 | A | 4/1985 | Scully |
| 4,599,133 | A | 7/1986 | Miyao et al. |
| 5,326,335 | A | 7/1994 | Takei |
| 5,372,089 | A | 12/1994 | Yoshida et al. |
| 5,432,122 | A | 7/1995 | Chae |
| 5,459,707 | A | 10/1995 | Morimoto |
| 5,589,007 | A | 12/1996 | Fujioka et al. ............... 136/249 |
| 5,904,550 | A | 5/1999 | Yamaguchi .................. 438/487 |
| 5,970,368 | A | 10/1999 | Sasaki et al. ................. 438/487 |
| 5,993,538 | A | 11/1999 | Asakawa et al. ............... 117/8 |
| 6,008,101 | A | 12/1999 | Tanaka et al. |

(Continued)

FOREIGN PATENT DOCUMENTS

CN           1284741           2/2001

(Continued)

*Primary Examiner*—N Drew Richards
*Assistant Examiner*—Joannie A Garcia
(74) *Attorney, Agent, or Firm*—Greer, Burns & Crain, Ltd.

(57) ABSTRACT

Laser beams emitted by a plurality of laser sources are divided into a plurality of sub-beams, which are irradiated onto selected portions of an amorphous semiconductor on a substrate to crystallize the amorphous semiconductor. A difference in diverging angles between the laser beams is corrected by a beam expander. The apparatus includes a sub-beam selective irradiating system including a sub-beam dividing assembly and a sub-beam focussing assembly. Also, the apparatus includes laser sources, a focussing optical system, and a combining optical system. A stage for supporting a substrate includes a plurality of first stage members, a second stage member disposed above the first stage members, and a third stage member 38C, rotatably disposed above the second stage to support an amorphous semiconductor.

4 Claims, 18 Drawing Sheets

U.S. PATENT DOCUMENTS

| | | |
|---|---|---|
| 6,037,313 A | 3/2000 | Nagaishi et al. |
| 6,081,381 A | 6/2000 | Shalapenok et al. |
| 6,210,996 B1 | 4/2001 | Yamazaki et al. |
| 6,347,176 B1 | 2/2002 | Hawryluk et al. |
| 6,403,920 B1 | 6/2002 | Muneyuki et al. |
| 6,524,977 B1 | 2/2003 | Yamazaki et al. |
| 6,554,464 B1 | 4/2003 | Hawryluk et al. |
| 6,632,711 B2 | 10/2003 | Sugano et al. |
| 6,730,550 B1 | 5/2004 | Yamazaki et al. |
| 6,753,212 B2 | 6/2004 | Yamazaki et al. ............ 438/166 |
| 6,770,546 B2 | 8/2004 | Yamazaki ................... 438/487 |
| 6,870,125 B2 | 3/2005 | Doi et al. |
| 6,884,699 B1 | 4/2005 | Ogawa et al. |
| 6,974,731 B2 | 12/2005 | Yamazaki et al. |
| 7,179,698 B2 | 2/2007 | Yamazaki et al. |
| 2001/0009251 A1 | 7/2001 | Sekizawa et al. |
| 2002/0027716 A1 | 3/2002 | Tanaka et al. |
| 2002/0082801 A1 | 6/2002 | Shiraishi |
| 2002/0146874 A1 | 10/2002 | Kawasaki et al. ............ 438/166 |
| 2003/0021307 A1 | 1/2003 | Yamazaki ................... 372/24 |
| 2003/0027382 A1 | 2/2003 | Uehara et al. ............... 438/200 |
| 2004/0074881 A1 | 4/2004 | Oishi |

FOREIGN PATENT DOCUMENTS

| | | |
|---|---|---|
| JP | 60-126840 | 7/1985 |
| JP | 01-239837 | 9/1989 |
| JP | 04-282869 | 10/1992 |
| JP | 05-177488 | 7/1993 |
| JP | 05-226790 | 9/1993 |
| JP | 06-289431 | 10/1994 |
| JP | 07-266064 | 10/1995 |
| JP | 09-225672 | 9/1997 |
| JP | 10-144620 | 5/1998 |
| JP | 11-186163 | 7/1999 |
| JP | 2000-233291 | 8/2000 |
| JP | 2000-252228 | 9/2000 |
| JP | 2001-023919 | 1/2001 |
| JP | 2001-044120 | 2/2001 |
| JP | 2001-269789 | 10/2001 |
| JP | 2002-141300 | 5/2002 |
| KR | 2002-0018630 | 3/2002 |
| WO | WO 02/31871 | 4/2002 |

Fig.14
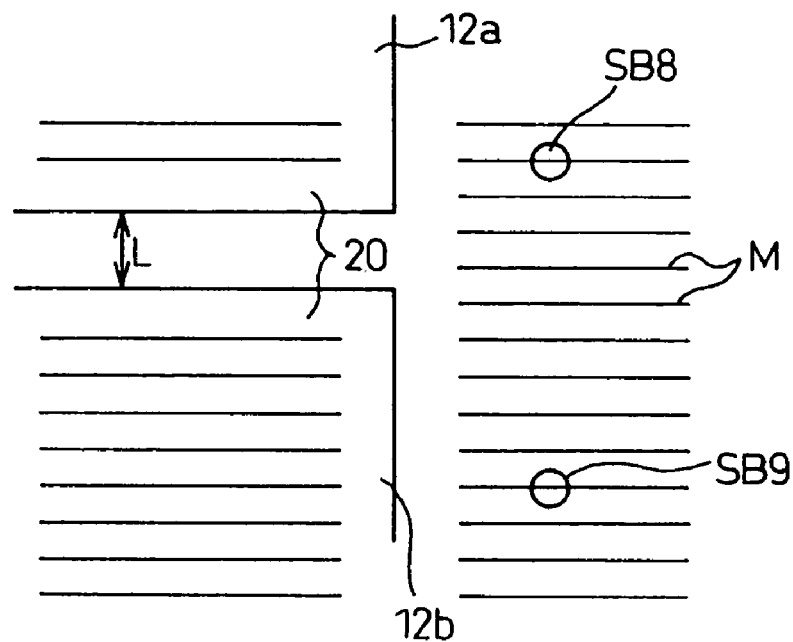
Fig.15
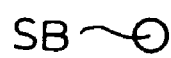

APPARATUS FOR CRYSTALLIZING SEMICONDUCTOR WITH LASER BEAMS

This is a divisional of application Ser. No. 10/436,673, filed May 13, 2003 now U.S. Pat. No. 6,977,775.

BACKGROUND OF THE INVENTION

1. Field of the Invention

The present invention relates to a method and an apparatus for crystallizing a semiconductor.

2. Description of the Related Art

A liquid crystal display device includes an active matrix drive circuit which includes TFTs. Also, a system liquid crystal display device includes an electronic circuit including TFTs in the peripheral regions around the display region. Low-temperature polysilicon is suitable for forming TFTs for the liquid crystal display device and TFTs for the peripheral region of the system liquid crystal display device. Also, low-temperature polysilicon is applied to pixel driving TFTs for an organic EL display, an electronic circuit for the peripheral region of the organic EL display and the like. The present invention relates to a method and an apparatus for crystallizing a semiconductor, using a CW laser (continuous wave laser), for producing TFTs with low-temperature polysilicon.

In order to form TFTs of the liquid crystal display device with low-temperature polysilicon, in the prior art, an amorphous silicon layer is formed on a glass substrate, and the amorphous silicon layer on the glass substrate is irradiated by an excimer pulse laser to crystallize the amorphous silicon. Recently, a crystallization method has been developed wherein the amorphous silicon layer on the glass substrate is irradiated by a CW solid laser to crystallize the amorphous silicon.

In crystallization of silicon by means of the excimer pulse laser, mobility is in the order of 150 to 300 ($cm^2$/Vs) but, on the other band, in crystallization of silicon by means of the CW laser, mobility in the order of 400 to 600 ($cm^2$/Vs) can be realized, this being particularly advantageous in forming TFTs for electronic circuits in the peripheral region of the system liquid crystal display device.

In crystallizing silicon, the silicon layer is scanned by a laser beam. In this case, the substrate having the silicon layer is mounted on a movable stage, and the scanning is performed while the silicon layer is moved with respect to the fixed laser beam. As shown in FIG. 19, in the excimer pulse laser scanning, scanning can be performed with a laser beam having, for example, a beam spot "X" of 27.5 mm×0.4 mm, and the area scan speed is 16.5 $cm^2$/s when the beam width is 27.5 mm and the scan speed is 6 mm/s.

On the other hand, as shown in FIG. 20, in the CW solid laser scanning, scanning can be performed with a beam spot "Y" of, for example, 400 μm×20 μm, and when scanning is performed at a scan speed of 50 cm/s, an acceptable crystallization melt width is 150 μm and the area scan speed is 0.75 $cm^2$/s. In this manner, crystallization by means of a CW solid laser, polysilicon of excellent quality can be obtained but there is the problem that the throughput is low. Also, it is possible to perform scanning at the scan speed of 2 m/s, in which case the area scan speed is 5 $cm^2$/s. However, the mobility of the polysilicon thus attained is low.

In crystallization by means of a CW solid laser, because the output of a stable CW laser is relatively low, even if the scan speed is increased, there is the problem that the area scan speed is low and throughput does not increase sufficiently.

In addition, if scanning is performed by the CW laser with a laser power of, for example, 10 W, the width "Y" of a beam spot of approximately 400 μm, and a scan speed of 50 cm/s, an effective melt width with a beam spot of 400 μm, at which acceptable crystallization can be attained, would be 150 μm, therefore the area scan speed is 0.75 $cm^2$/s. In this manner, in crystallization by means of a CW solid laser, although polysilicon of excellent quality can be attained, there is still the problem of low throughput.

Further, as shown in FIG. 29, in the prior art, the movable stage supporting the substrate having the silicon layer comprises a Y-axis stage 1, an X-axis stage 2, a rotatable stage 3, and a vacuum chuck 4. Usually, the Y-axis stage 1, which is in the lowermost position, has a large high-speed structure that is highly mobile, and the X-axis stage 2, which is positioned above the Y-axis stage 1, has a relatively small and less mobile structure. The Y-axis stage 1 which is in the lowermost position takes the load of all of the upper components. A substrate including an amorphous semiconductor is secured the vacuum chuck 4, a laser beam is irradiated onto the amorphous semiconductor while the movable stages are moved, and the amorphous semiconductor is crystallized by being molten and hardened to form polysilicon.

With the excimer pulse laser, because the beam spot formed is relatively large, a high area scan speed can be achieved. However, with a CW solid laser, because the beam spot formed is extremely small, the area scan speed is quite low. Therefore, crystallization by means of a CW solid laser can achieve excellent quality polysilicon, but has low throughput.

In order to improve the throughput of crystallization by means of laser scanning, the substrate having the silicon layer must be moved reciprocally at the highest possible speed. In other words, the substrate is accelerated from a stationary state, continues to move at a constant speed while being scanned with laser, and thereafter is decelerated to a stationary state. Then, the substrate is moved in the opposite direction, at which time the substrate is accelerated, moves at a constant speed, and is decelerated to a stationary state. Laser scanning is executed while this reciprocal movement of the substrate is repeated.

In order to effectively perform high speed scanning, it is necessary to increase the acceleration/deceleration of the high speed Y-axis stage 1. However, if the acceleration is increased, the shock of acceleration is increased, and this shock is in proportion to the product of the acceleration and the weight of the loads supported by the stage. A large shock will vibrate the optical system for emitting the laser beam, shifting the adjustment thereof, thus putting the optical system out of focus and moving the focusing position, making stable crystallization unattainable.

In the prior art, because the Y-axis stage 1 which moves at high speed supports the load of all the other stage components, and the weight of this load is large, the acceleration thereof cannot be sufficiently increased and the substrate cannot be accelerated to a high speed in a short time.

Further, the rotatable stage 3 is used to correct dislocation of the rotation position of the substrate having the silicon layer, and can be rotated within the range of approximately 10 degrees. In order to rotate the substrate having the silicon layer 90 degrees, it is necessary to remove the substrate from the vacuum chuck 4 and reattach the substrate to the vacuum chuck 4. Consequently, in the prior art, 90 degree rotation of the substrate having the silicon layer is not performed.

SUMMARY OF THE INVENTION

The object of the present invention is to provide a method and an apparatus for crystallizing a semiconductor that can increase throughput even in the case where a CW solid laser is used.

A method for crystallizing a semiconductor, according to the present invention, comprises the steps of dividing a laser beam emitted by a laser source into a plurality of sub-beams, and selectively irradiating the sub-beams onto an amorphous semiconductor on a substrate, wherein laser beams emitted by a plurality of laser sources are simultaneously irradiated onto the semiconductor and a difference between diverging angles of the plurality of laser beams is corrected.

Also, an apparatus for crystallizing a semiconductor, according to the present invention, comprises at least one laser source, beam dividing means for dividing a laser beam emitted by the laser source into a plurality of sub-beams, at least one focussing optical system for focusing the sub-beams on an amorphous semiconductor on a substrate, a moving mechanism for changing a distance between at least two spot positions of the sub-beams formed by the focussing optical system, first mirrors for directing a laser beam to the focussing optical system, and second mirrors provided in the focussing optical system to receive the sub-beams reflected by the first mirrors, wherein the sub-beams between the first mirrors and the second mirrors are parallel to a direction of movement of the moving mechanism.

In these structures, throughput can be improved by simultaneously irradiating a plurality of sub-beams. In the display region of the display device, the TFT portions are limited compared to the surface area of the pixels so, in light of the fact that it is not necessary to crystallize the entire display region, throughput can be further increased by selectively irradiating the sub-beams onto only those portions that must be crystallized. Although those portions that are not irradiated by the beam remain an amorphous semiconductor, they are eliminated when the TFTs are separated and, therefore, they pose no problem if they are left as amorphous semiconductors.

Next, a method for crystallizing a semiconductor, according to the present invention, comprises the step of irradiating laser beams emitted by a plurality of laser sources onto a semiconductor layer on a substrate through a focussing optical system to melt and crystallize the semiconductor layer, wherein the plurality of laser beams are irradiated onto the substrate without overlap, scan the semiconductor layer in parallel to each other, and are positioned so that their molten tracks overlap each other.

Also, a method for crystallizing a semiconductor, according to the present invention, comprises the step of irradiating laser beams emitted by a plurality of laser sources onto a semiconductor layer on a substrate through a focussing optical system to melt and crystallize the semiconductor layer, wherein a plurality of beam spots formed by the laser beams emitted by the laser sources at least partially overlap each other.

Further, an apparatus for crystallizing a semiconductor, according to the present invention, comprises first and second laser sources, a focussing optical system, and a combining optical system for guiding laser beams emitted by the first and second sources to the focussing optical system, wherein the combining optical system comprises a λ/2 plate disposed after the first laser source, a beam expander disposed after at least one of the first and second laser sources, and a polarizing beam splitter for combining laser beams emitting by the first and second laser sources.

In these structures, by irradiating laser beams emitted by the first and second laser sources onto an amorphous semiconductor on a substrate through the focussing optical system, the irradiated beam spot can be increased in size. By increasing the size of the beam spot, the melt width increases and, therefore, even if the necessary scan speed is constant in order to attain high quality polysilicon, the area scan speed is high. Hence, polysilicon of excellent quality can be attained with a high throughput.

Next, an apparatus for crystallizing a semiconductor, according to the present invention, comprises a laser source, a stage for supporting a substrate including an amorphous semiconductor, and an optical focussing system, wherein the stage comprises a plurality of first stage members disposed in parallel and movable simultaneously in a first direction, a second stage member disposed above the first stage members and movable in a second direction perpendicular to the first direction, and a third stage member rotatably disposed above the second stage member, whereby a laser beam emitted by the laser source is irradiated onto a semiconductor on a substrate fixed to the third state member through the optical focusing system to melt and crystallize the semiconductor.

In this structure, in the stage for supporting the substrate including the amorphous semiconductor, a plurality of first stage members are disposed at the lowermost position and support the second stage member and the third stage member. The second stage member can be moved at high speed. Consequently, it is not necessary for the high speed movable second stage member to support the plurality of first stage members, and therefore the load thereon is small. The plurality of first stage members move simultaneously and support the second stage member without bending, which is long, because it moves at high speed. Accordingly, the second stage member can be a high-speed member and the crystallization throughput can be improved.

Also, a method for crystallizing a semiconductor, according to the present invention, comprising the step of irradiating a laser beam onto a semiconductor on a substrate having a display region and a peripheral region around the display region to melt and crystallize the semiconductor, performing crystallization of the peripheral region in a first scanning direction, after rotating a rotatable stage supporting the substrate by 90 degrees, performing crystallization of the peripheral region in a second scanning direction perpendicular to the first scanning direction, and performing crystallization of the display region in a third scanning direction parallel to a direction along which sub-pixel regions of the three primary colors of pixels are arranged.

In this structure, crystallization of the peripheral region and crystallization of the display region can be continuously performed, and overall crystallization throughput can be improved.

BRIEF DESCRIPTION OF THE DRAWINGS

The present invention may be more fully understood from the description of preferred embodiments of the invention set forth below, together with the accompanying drawings, wherein:

FIG. 14 is a view showing the relationship between two glass substrates and a plurality of sub-beams;

FIG. 15 is a view showing an example of an arrangement of sub-beams;

DESCRIPTION OF THE PREFERRED EMBODIMENTS

Embodiments of the present invention will be explained hereunder with reference to the drawings.

Figure 1:
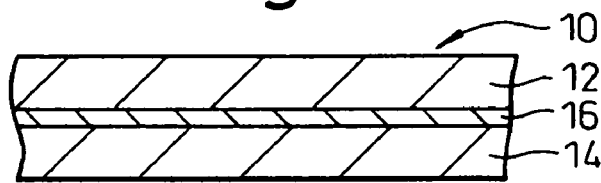
FIG. 1 is a schematic sectional view showing a liquid crystal display device according to an embodiment of the present invention.

FIG. 1 is a schematic sectional view showing the liquid crystal display device according to an embodiment of the present invention. The liquid crystal display device 10 comprises a pair of opposing glass substrates 12 and 14 and a liquid crystal 16 inserted therebetween. Electrodes and alignment layers can be provided on the glass substrates 12 and 14. One of the glass substrates 12 is a TFT substrate, and the other glass substrate 14 is a color filter substrate.

Figure 2:
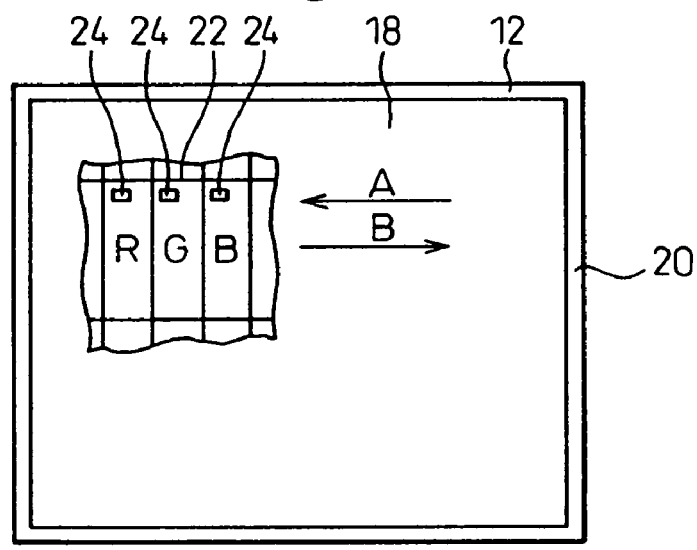
FIG. 2 is a schematic plan view showing a glass substrate of FIG. 1.

FIG. 2 is a schematic plan view showing the glass substrate 12 of FIG. 1. The glass substrate 12 has a display region 18 and a peripheral region 20 around the display region 18. The display region 18 includes a large number of pixels 22. In FIG. 2, one pixel 22 is shown in a partial enlargement. The pixel 22 includes three primary color sub-pixel regions R, G and B, and a TFT 24 is formed in each of the sub-pixel regions R, G and B. The peripheral region 20 has TFTs (not shown), the TFTs in the peripheral region 20 being arranged more densely than the TFTs 24 of the display region 18.

The glass substrate 12 of FIG. 2 forms a 15" QXGA liquid crystal display device and has 2048×1536 pixels 22. 2048 pixels are arranged in the direction in which the three primary color sub-pixel regions R, G and B are arranged (horizontally), so that the number of sub-pixel region R, G and B is 2048×3. 1536 pixels are arranged in a direction perpendicular (vertically) to the direction in which the three primary color sub-pixel regions R, G and B are arranged (horizontally). In the process of the semiconductor crystallization, laser scanning is performed in directions parallel to sides of the peripheral region 20, and laser scanning is carried out in the display region 18 in the directions indicated by the arrows A and B.

The reason for this is that, because the TFTs 24 are densely arranged in the direction of the arrows A and B and sparsely arranged in the direction perpendicular to the direction of the arrows A and B, and on the mother glass, which is substantially square, the number of laser scans required in the A/B direction is less, therefore throughput is higher.

Figure 3:
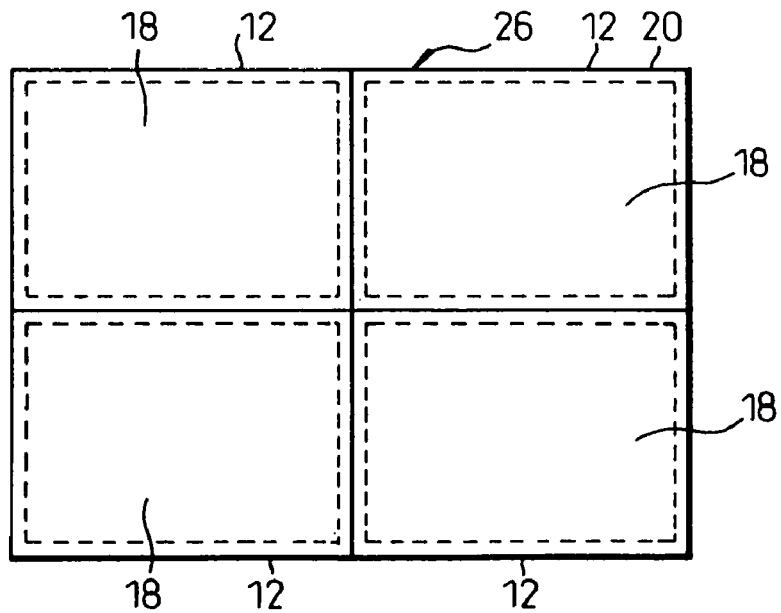
FIG. 3 is a schematic plan view showing a mother glass for making the glass substrate of FIG. 2.

FIG. 3 is a schematic plan view showing a mother glass 26 for making the glass substrate 12 of FIG. 2. The mother glass 26 encompasses a plurality of the glass substrates 12. In the example shown in FIG. 3, one mother glass 26 includes four glass substrates 12, but one mother glass 26 can include more than four glass substrates 12.

Figure 4:
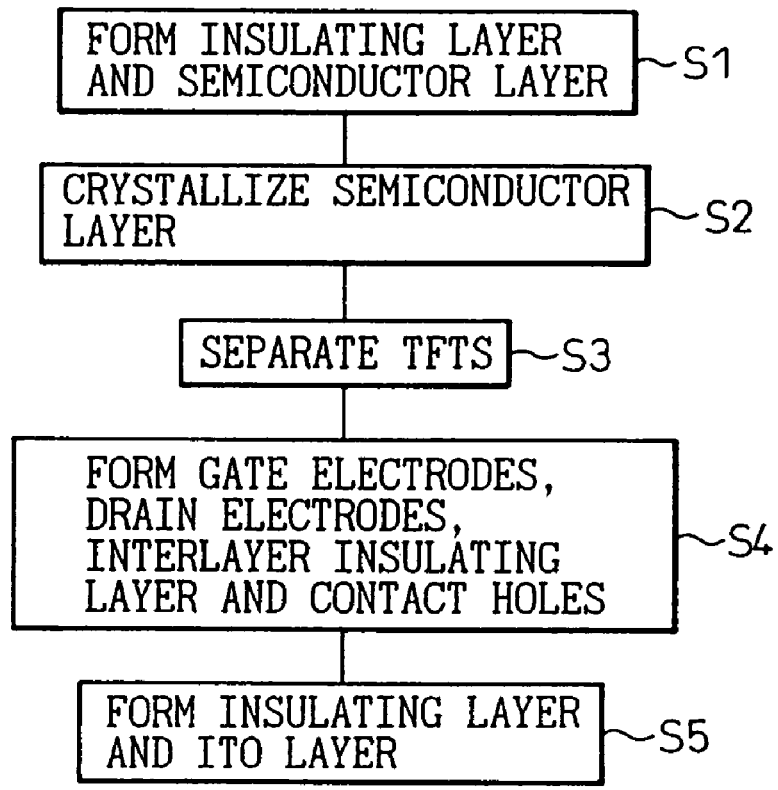
FIG. 4 is a flowchart showing the process of forming the TFTs on the glass substrate and the TFTs of the peripheral region.

FIG. 4 is a flowchart showing the process of forming the TFTs 24 of the glass substrate 12 and the TFTs of the peripheral region 20. In step S1, an insulating layer and an amorphous silicon layer are formed on the glass substrate. In step S2, the amorphous silicon layer is crystallized to form polysilicon. In step S3, the TFTs are separated, leaving the necessary silicon portions such as those silicon portions that are to become TFTs and the like, and eliminating the unnecessary polysilicon and amorphous silicon layer portions. In step S4, gate electrodes, drain electrodes, interlayer insulating layers, and contact holes are formed. In step S5, an insulating layer and an ITO layer are formed, and the glass substrate 12 is completed. The ITO layer becomes pixel electrodes for forming the pixels 22.

Figure 5:
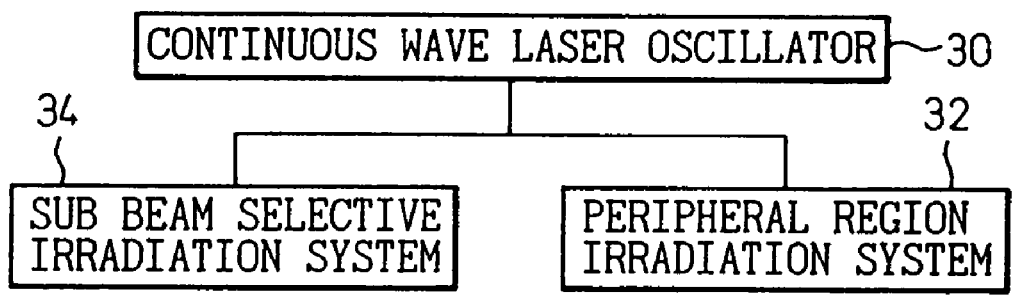
FIG. 5 is a flowchart showing the content of the crystallizing step of FIG. 4.

FIG. 5 is a flowchart showing the content of the crystallization step S2 of FIG. 4. A CW laser (continuous wave laser) oscillator 30 is used in the crystallization step S2. The laser beam output from the CW laser oscillator 30 is supplied to a peripheral region irradiation system 32 and a sub-beam selective irradiation system 34 one after another. Firstly, the laser beam is focussed and irradiated onto the amorphous silicon of the peripheral region 20 of the glass substrate 12 to melt and harden the amorphous silicon to crystallize it into a polysilicon. Then, the sub-beam is selectively focussed and irradiated onto the amorphous silicon 36 of the display region 18 of the glass substrate 12 to melt and harden the amorphous silicon to crystallize it into a polysilicon.

Since the TFTs of the peripheral region 20 are arranged more densely than the TFTs 24 of the display region 18, high quality polysilicon is required in the peripheral region. In the peripheral region irradiation system 32, the peripheral region 20 is irradiated with a relatively high power laser beam from the CW laser oscillator 30 at a relatively low scan speed. If used in the example described above, scanning is performed with a beam width of 250 μm and a scanning speed of 40 cm/s, giving an area scan speed of 1 $cm^2$/s.

On the other hand, as the TFTs 24 of the display region 18 do not require polysilicon of higher quality, in the sub-beam selective irradiation system 34, a laser beam from the CW laser oscillator 30 is divided into sub-beams, to be described later, and the display region 18 is irradiated by these sub-beams at a relatively high scanning speed. By this means, the overall throughput is improved and high quality polysilicon is attained in the regions that require it.

Figure 6:
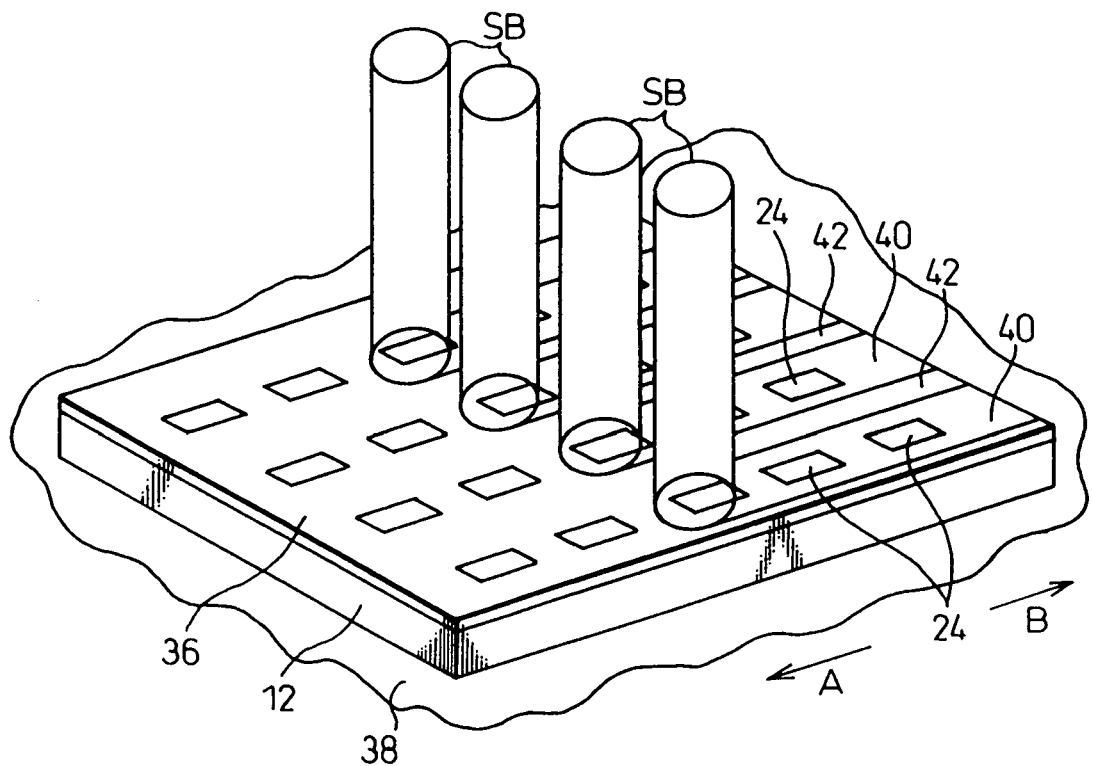
FIG. 6 is a perspective view showing an example of selectively irradiating the amorphous silicon layer in the display region on the glass substrate with sub-beams.

FIG. 6 is a view showing an example of selectively irradiating the amorphous silicon layer of the display region 18 on the glass substrate 12 with a plurality of sub-beams SB emitted by the sub-beam selective irradiation system 34. The plurality of sub-beams SB are divided from laser beam output from the CW laser oscillator 30 to form beam spots at predetermined intervals. Numeral 36 denotes the amorphous silicon layer formed on the glass substrate 12, and the glass substrate 12 is fixed to a XY stage 38 by means of a vacuum chuck of the XY stage.

The sub-beams SB are arranged so as to form beams spots in stripe-shaped portions 40 on the amorphous silicon layer 36 that includes positions where TFTs 24 are to exist, and the XY stage 38 moves (scans) in the directions of the arrows A and B. The remaining stripe-shaped portions 42 of the amorphous silicon layer 36 are not irradiated. That is, the stripe-shaped portions 40 of the amorphous silicon layer 36 are selectively irradiated with the sub-beams SB.

Figure 7:
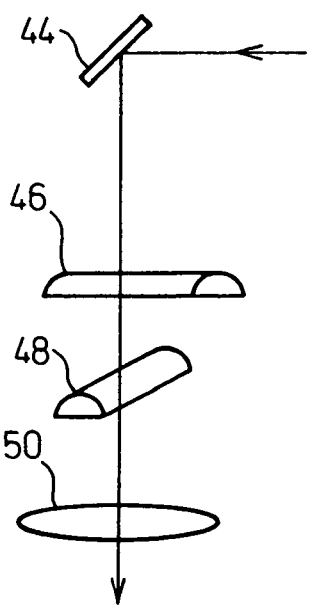
FIG. 7 is a view showing the optical device for adjusting the beam spot of the sub-beam.

FIG. 7 is a view showing the optical system for adjusting the beam spots of the sub-beams SB. This optical system comprises a mirror 44 for diverting the optical path of the sub-beam SB, a substantially semicircular cylindrical lens 46, a substantially semicircular cylindrical lens 48 arranged perpendicularly to the lens 46, and a convex lens 50. By means of this optical system, the beam spot of the sub-beam SB is formed into ellipses.

Figure 8:
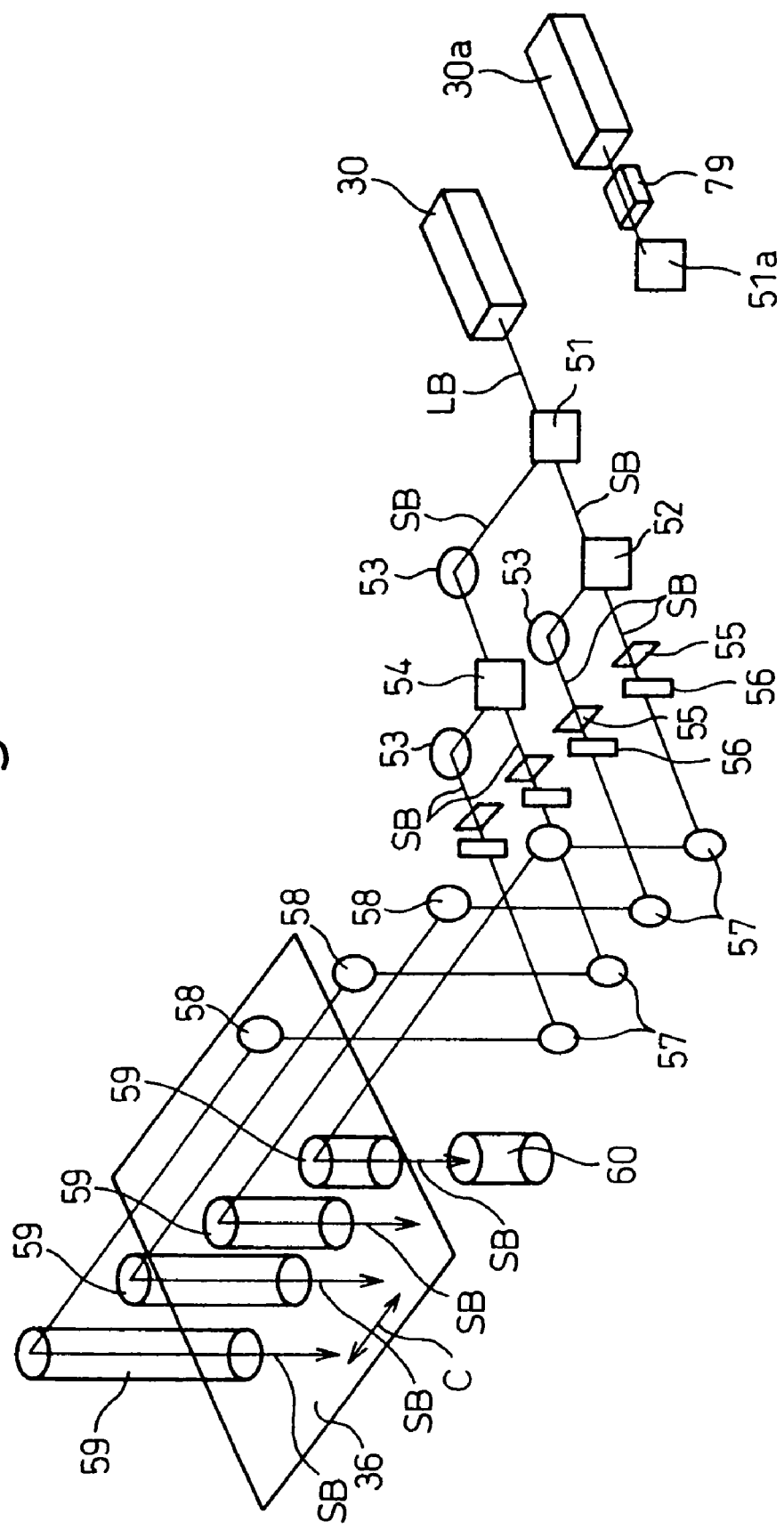
FIG. 8 is a view showing the CW laser oscillators and a sub-beam selective irradiation system.

FIG. 8 is a view showing a plurality of CW laser oscillators 30 and 30a, and the sub-beam selective irradiation systems 34. A half-mirror 51 is arranged in front of the CW laser oscillator 30 so that the laser beam LB emitted by the CW laser oscillator 30 is divided into two sub-beams SB by the half-mirror 51. One sub-beam SB passing through the half-mirror 51 is further divided into two sub-beams SB by another half-mirror 52. Numeral 53 indicates a mirror. The other sub-beam SB reflected by the half-mirror 51 is further divided into two sub-beams SB by another half-mirror 54. In this manner, the laser beam LB emitted by the CW laser oscillator 30 is divided into four sub-beams SB.

An independently adjustable shutter 55 and an independently adjustable ND filter 56 are arranged in each of the optical paths of the sub-beams SB. The shutters 55 can interrupt the sub-beams SB as necessary. The ND filters 56 can adjust the power of the sub-beams SB.

Further, mirrors 57 are arranged in order to divert the horizontal sub-beams SB upwards in a vertical direction, and mirrors 58 are arranged in order to divert the vertical sub-beams SB sideways in a horizontal direction. The mirrors 58 divert the sub-beams SB parallel to the glass substrate 12 at different heights. The horizontal sub-beams SB are diverted downwards in a vertical direction by focussing units 59, condensed by the focussing units 59, and irradiated onto the amorphous silicon layer 36 in predetermined beam spots.

Each focussing unit 59 includes the mirror 44, the lens 46, the lens 48 and the convex lens 50 shown in FIG. 7, these optical components forming one unit. The focussing units 59 are movable within an allowable range in the direction indicated by the arrow C. Beam profilers 60 are arranged on the optical axis on each of the focussing units 59. The beam profilers 60 correct the focus positions of the respective sub-beams SB. Also, the beam profilers 60 can detect the focus positions of the respective sub-beams SB.

Between the half-mirror 51 and the ND filters 56, the four sub-beams SB are arranged at equal intervals parallel to each other within a horizontal plane parallel to the glass substrate 12. Between the mirrors 57 and the focussing units 59, the sub-beams SB are arranged at equal intervals parallel to each other within a vertical plane perpendicular to the glass substrate 12. The glass substrate 12 having the amorphous silicon layer 36 is moved (scanned) in the direction A/B perpendicular to this vertical plane.

The area scan speed in the sub-beam selective irradiation system 34 is defined by the number of sub-beams×the scan speed×intervals between the stripe-shaped portions 40 of the amorphous silicon layer 36. For this reason, it is preferable to divide the laser beam LB into a plurality of sub-beams SB, and to increase the number of laser oscillators 30, so that sufficient power necessary for crystallization is provided and the number of sub-beams is increased.

In FIG. 8, another laser oscillator 30a is arranged parallel to the laser oscillator 30 and, with this laser oscillator 30a, optical components (half-mirrors, mirrors, focussing units, and the like, not shown in the drawing) identical to the optical components belonging to the laser oscillator 30 are provided, so that it can form a further four sub-beams SB. In this case, eight sub-beams SB are all arranged at equal intervals parallel to each other within the same horizontal plane.

A beam expander 79 is arranged between the laser oscillator 30a and the first half-mirror 51a. The beam expander 79 adjusts the diverging angle of the laser beam LB. In other words, if there is an inconsistency between the diverging angles of the simultaneously radiated plurality of laser beams LB of the laser oscillators 30 and 30a, there is a case in which one laser beam LB (sub-beam SB) is focussed by the focussing optical system, the focus of the other laser beam LB (sub-beam SB) will not match, and therefore, by adjusting the diverging angle of the laser beam LB, the focuses of both of the laser beams LB will match. The beam expander 79 may also be arranged in the optical path of the other laser beam LB. Also, two of them can be arranged as one in each of the optical paths of both laser beams LB.

Figure 9:
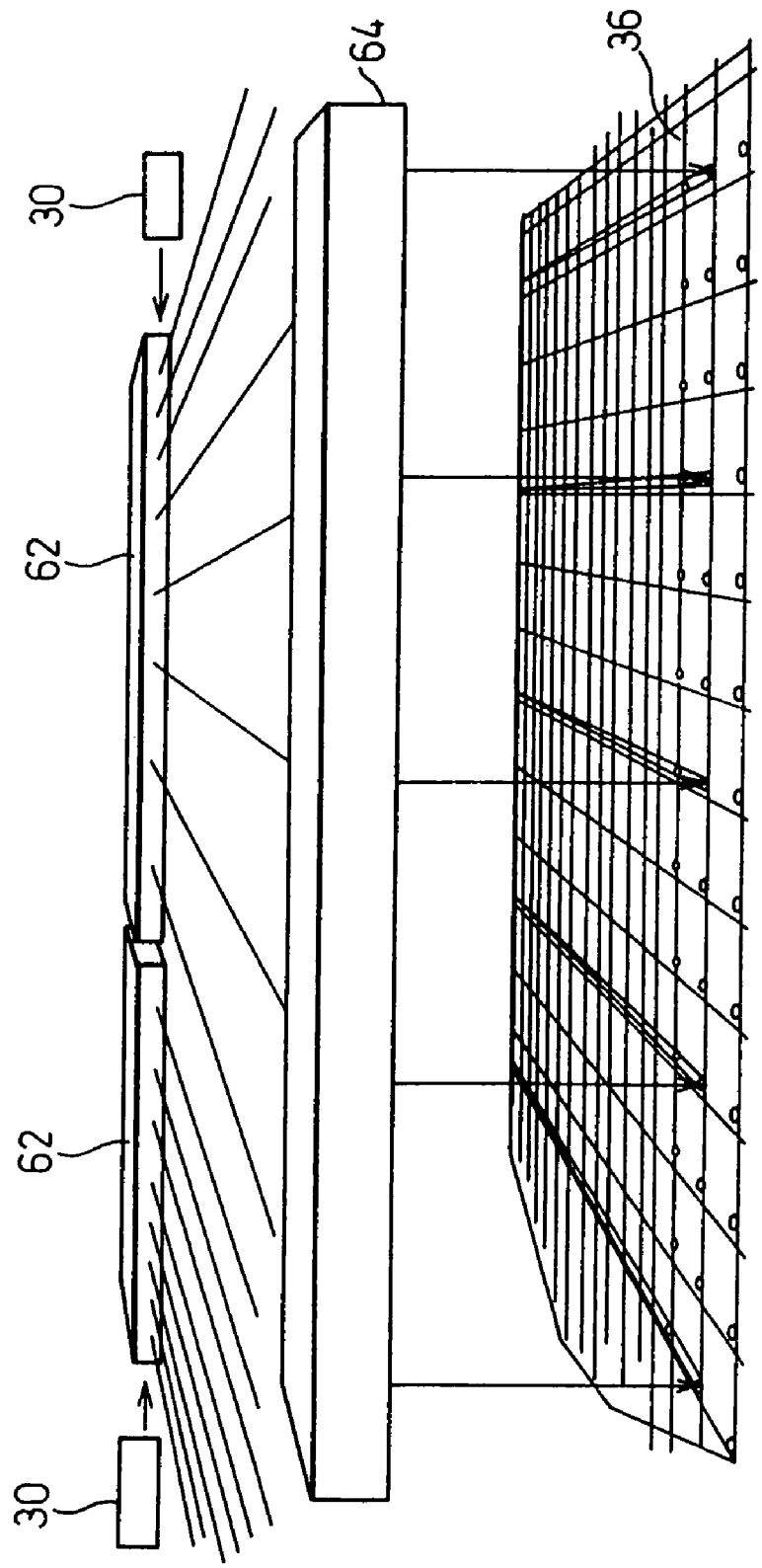
FIG. 9 is a view showing a sub-beam selective irradiation system forming sixteen sub-beams.

FIG. 9 is a view showing a sub-beam selective irradiation system 34 adapted to form sixteen sub-beams SB. This sub-beam selective irradiation system 34 includes four laser oscillators 30, two sub-beam dividing assemblies 62, and two sub-beam focussing assemblies 64. Two of the laser oscillators 30 corresponding to the two laser oscillators 30 and 30a of FIG. 8. One sub-beam dividing assembly 62 divides laser beams LB output from two of the laser oscillators 30 and 30a into eight sub-beams SB, and includes the optical components corresponding to those arranged between the half-mirror 51 and the ND filters 56 of FIG. 8. One sub-beam focussing assembly 64 is optically connected to one sub-beam dividing assembly 62, and includes the optical components corresponding to those from the mirrors 57 to the focussing units 59 of FIG. 8.

Figure 10:
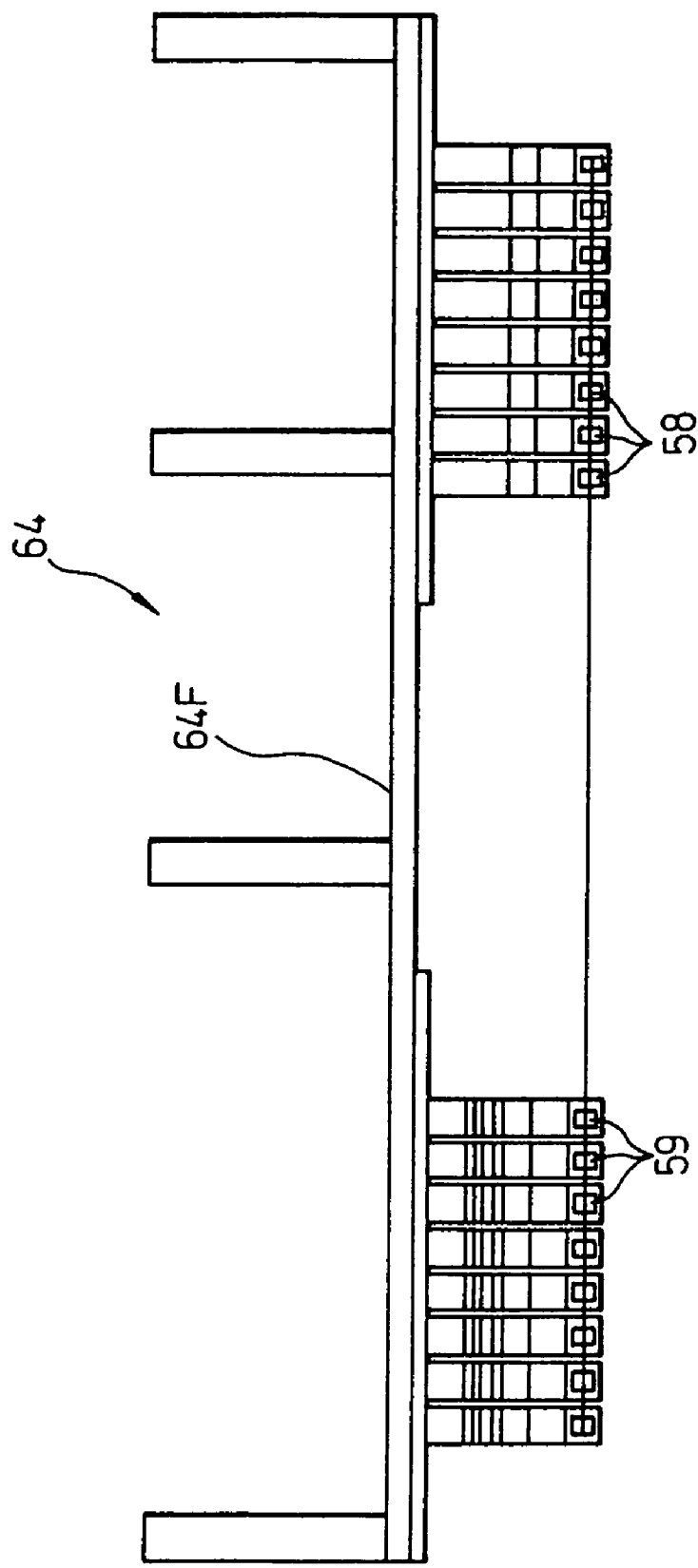
FIG. 10 is a plan view showing a specific example of the sub-beam focus assembly of FIG. 9.
Figure 11:
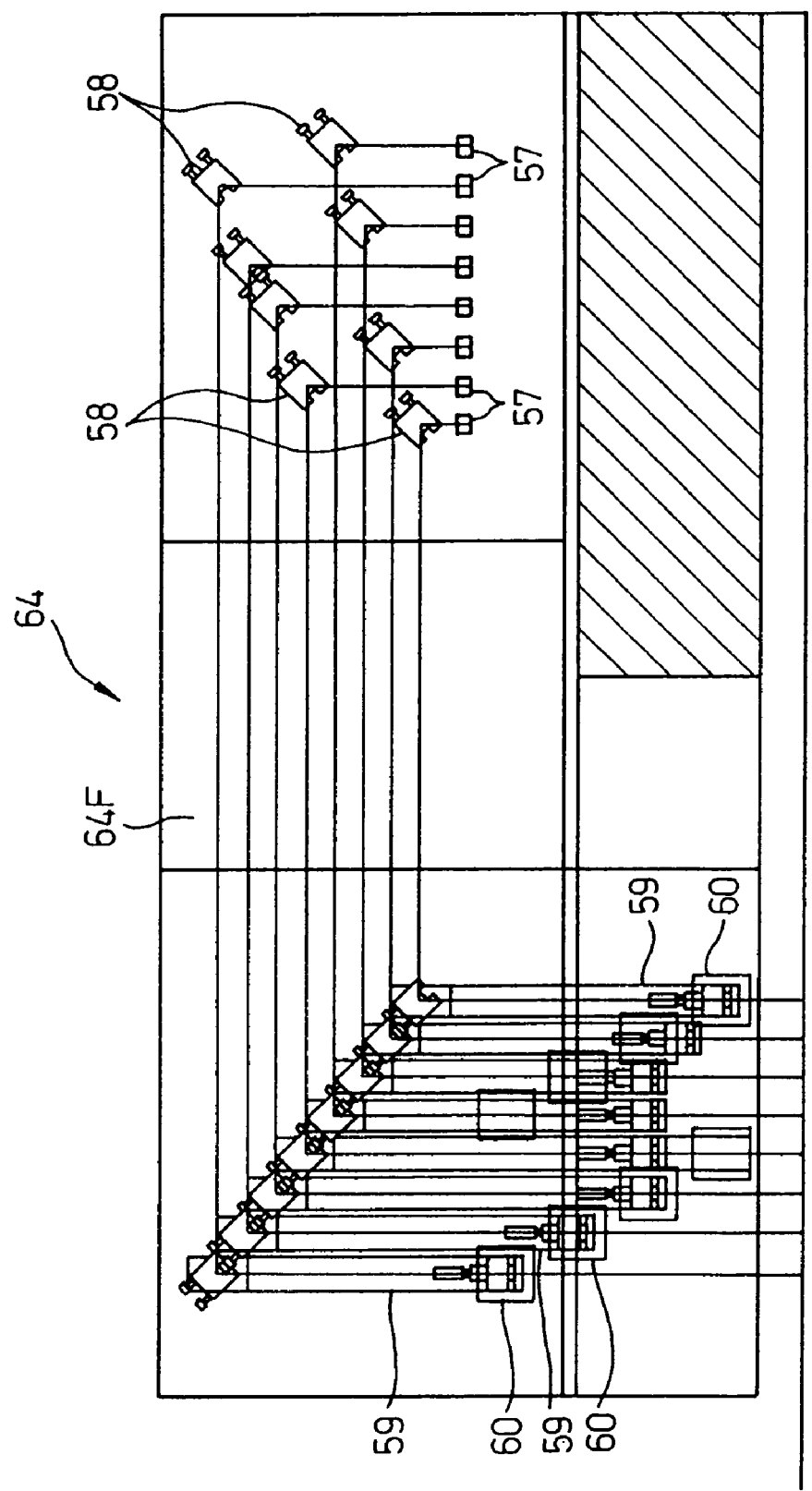
FIG. 11 is a front view showing the sub-beam focus assembly of FIG. 10.
Figure 12:
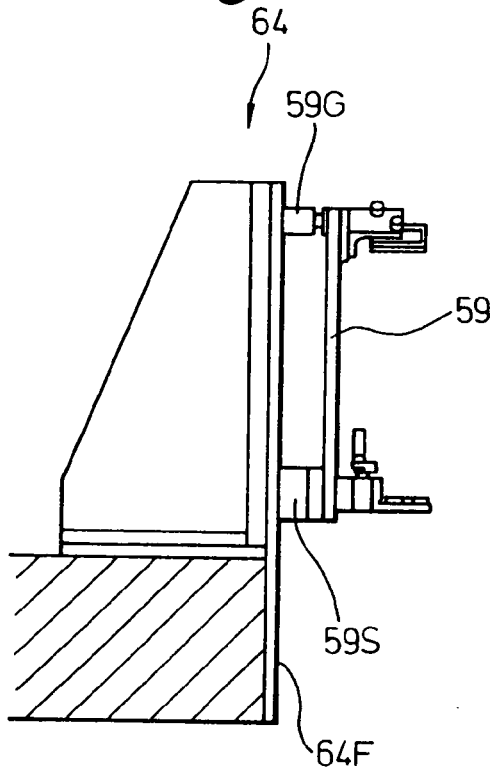
FIG. 12 is a side view showing the sub-beam focus assembly of FIG. 10.

FIG. 10 is a plan view showing a specific example of the sub-beam focussing assembly 64 of FIG. 9, FIG. 11 is a front view showing the sub-beam focussing assembly 64 of FIG. 10, and FIG. 12 is a side view showing the sub-beam focussing assembly 64 of FIG. 10. In FIG. 10 to FIG. 12, eight mirrors 57 and 58 and eight focussing units 59 are mounted to a frame 64F. Each focussing unit 59 is attached to the frame 64F by means of an electrically driven stage 59S, and is movable within an allowable range in the direction indicated by the arrow C in FIG. 8.

Where the peripheral region irradiation system 32 of FIG. 5 is used, the optical components from the half-mirror 51 to the focussing unit 59 of FIG. 8 are removed and optical components of the peripheral region irradiation system 32 are set in the position of the half-mirror 51.

In the above structure, the intervals of the TFTs 24 is equal to the pitch of the pixels 22. According to the present invention, the area scan speed is improved in proportion to the pixel pitch and the number of sub-beams. Also, the smaller the size of the TFTs 24, the more the surface area that requires melting can be reduced, therefore the number of sub-beams can be increased. Under the condition that the pixel pitch does not need to be excessively reduced, as far as the display be seen by the human eye, the size of the TFTs 24 can be reduced with advances in miniaturization techniques. As a result, crystallization can be selectively performed only on those portions where it is necessary, without supplying energy to areas that do not require it, so the throughput of the crystallization process can be improved, and an energy-saving process can be realized.

In an example, the size of the TFTs 24 is such that a channel length is approximately 4 μm and a channel width is approximately 5 μm. The fluctuation of the XY stage that can perform high-speed scanning at 2 m/s is in the order of a maximum of ±10 μm, and therefore the width of the sub-beams SB is at least 25 μm, and preferably 30 μm, with the consideration of allowance for other factors. The need for increasing the channel width can be easily achieved by the layout in which the channel width is arranged parallel to the scanning direction.

The melt width (the width at which the stripe portions 40 of the amorphous silicon layer 36 are melted) changes according to the scanning speed, the thickness of the silicon, the laser power, irradiation focusing lenses, and the like. In the case where the depth of the amorphous silicon layer 36 is 150 nm and an optical system with the lenses of F=200 mm and F=40 mm in combination, that can attain an elliptical beam spot, is used, and laser scanning is performed perpendicular to the long axis of the ellipse, an effective melt width of 30 μm can be attained. Consequently, even with the power loss accompanied by the division of the laser beam LB, if 2 W or more power can be supplied to the divided sub-beams SB, the necessary melt width of 30 μm can be maintained. The laser used is a Nd:YV04 continuous wave solid laser.

With respect to 10 W laser oscillation, the laser power values after division into four sub-beams are 2.3 W, 2.45 W, 2.45 W and 2.23 W, all over 2 W. It is believed that the deviation in power values of ten to twenty percent of the sub-beams SB is due to deviation in the characteristics of the mirrors and half-mirrors. Due to these values, power at the ND filter 56 is somewhat attenuated, so that the power values of the four sub-beams SB are all a uniform 2.2 W.

In FIG. 9, the 16 sub-beams SB are power adjusted by the ND filters 56 so that all 16 sub-beams SB are adjusted to have the same power value of 2.1 W. Because the diverging angles of the beams from different laser oscillators differ, the focussing positions also differ, so in order to correct this, the beam expander is provided immediately after the laser beam output from the laser oscillator and, by correcting the diverging angle thereof, the same focus positions can be attained. However, if the dislocation of a focus position does not differ significantly, a melt width of the same size can be achieved and no significant problems are caused even if crystallization is performed with the focus position dislocated.

In the glass substrate 12 of FIG. 2, the width of the peripheral regions is approximately 2 mm. Crystallization is performed using 16 sub-beams SB on the glass substrate 12 of a 15" QXGA display device. The size of the pixels 22 is 148.5 μm square. Consequently, the RGB sub-pixel size is 148.5 μm×49.5 μm. In order to reduce the number of scans and increase overall throughput, scanning is performed perpendicular to the side of 148.5 μm (the direction along which the RGB sub-pixels are arranged). The arrangement of the 16 sub-beams SB at 148.5 μm intervals is not possible due to the size of the optical system. The irradiating lenses of each of the focussing units 59 are arranged at intervals of 30 mm, and are movable within the range of ±4 mm by means of the electrically driven stage 59S with respect to the direction in which they are arranged.

As 30 mm/148.5 μm=202.02, a row of 202 TFTs 24 (the stripe portions 40 of the amorphous silicon layer 36) exists between two focussing units 59.

The interval between the first, endmost irradiating lens and the second irradiating lens is consequently 202×148.5 μm=29997 μm=30000−3.

The interval between the first, endmost irradiating lens and the third irradiating lens is 202×148.5 μm×2=59994 μm=30000×2−6.

The interval between the first, endmost irradiating lens and the fourth irradiating lens is 202×148.5 μm×3=89991 μm=30000×3−9.

The interval between the first, endmost irradiating lens and the fifth irradiating lens is 202×148.5 μm×4=119988 μm.

The interval between the first, endmost irradiating lens and the sixth irradiating lens is 202×148.5 μm×5=149985 μm.

The interval between the first, endmost irradiating lens and the seventh irradiating lens is 202×148.5 μm×6=179982 μm.

The interval between the first, endmost irradiating lens and the eighth irradiating lens is 202×148.5 μm×7=209979 μm.

The interval between the first, endmost irradiating lens and the ninth irradiating lens is 202×148.5 μm×8=239976 μm.

The interval between the first, endmost irradiating lens and the tenth irradiating lens is 202×148.5 μm×9=269973 μm.

The interval between the first, endmost irradiating lens and the eleventh irradiating lens is 202×148.5 μm×10=299970 μm.

The interval between the first, endmost irradiating lens and the twelfth irradiating lens is 202×148.5 μm×11=329967 μm.

The interval between the first, endmost irradiating lens and the thirteenth irradiating lens is 202×148.5 μm×12=359964 μm.

The interval between the first, endmost irradiating lens and the fourteenth irradiating lens is 202×148.5 μm×13=389961 μm.

The interval between the first, endmost irradiating lens and the fifteenth irradiating lens is 202×148.5 μm×14=419958 μm.

The interval between the first, endmost irradiating lens and the sixteenth irradiating lens is 202×148.5 μm×15=449955 μm=30000×15−45.

Accordingly, each irradiating lens is finely adjusted from a designed average position to 3 μm in the minus direction in the case of the second irradiating lens, 6 μm in the minus direction for the third irradiating lens, . . . , 45 μm in the minus direction for the sixteenth irradiating lens. Thus, the sub-beams are focused on the respective TFT regions. In this state, the sub-beams are irradiated with the output of the laser oscillators 30 of 10 W and the scanning speed of 2 m/s. Irradiation is performed with each sub-beam SB of the power of 2 W.

Figure 13:
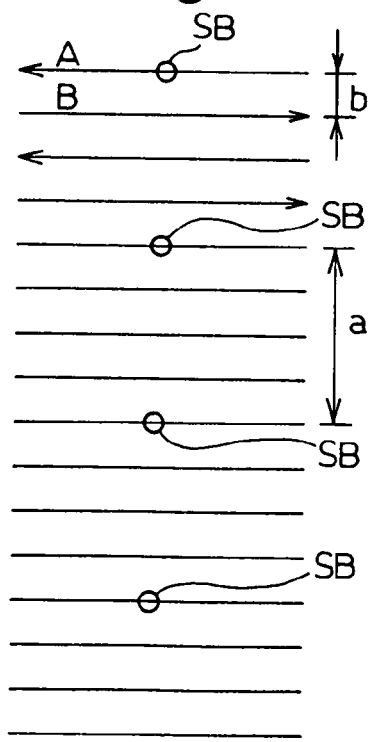
FIG. 13 is a view showing the relationship between the sub-beams and the scan pitch.

FIG. 13 is a view showing the relationship between the sub-beams SB and scan intervals. As shown in FIG. 13, the sub-beams SB are arranged at intervals "a", which is (3 mm-3 µm). The interval between TFTs 24, i.e. the scan interval "b", is 148.5 µm. Scanning is performed while the XY stage 38 is moved reciprocally in the direction indicated by the arrows A and B. In other words, after the XY stage 38 moves in the direction of the arrow A, the XY stage then moves 148.5 µm in the direction perpendicular to the arrows A and B, then moves in the direction of the arrow B, then again moves 148.5 µm in the direction perpendicular to the arrows A and B. This operation is repeated. In FIG. 13, although each of the sub-beams SB is shown as scanning four times, in the example being explained here, each sub-beam SB scans 202 times.

In one scan in one scanning direction, the 16 sub-beams SB crystallize stripe portions 40 of the amorphous silicon layer 36 at the interval for 202 pixels. Next, in the reverse scan, the 16 sub-beams SB crystallize the adjacent stripe portions 40 of the amorphous silicon layer 36 at the interval for 202 pixels. In 101 reciprocal scans (i.e. 202 scans), portions corresponding to 202×16=3332 pixels can be scanned. In this case, the area scan speed is 148.5 µm×2 m/s=47.5 cm$^2$/s.

However, in the glass substrate 12 in this example, the number of pixels in the vertical direction is only 1536. Consequently, in the next example to be explained, not 16, but rather 8 sub-beams SB are used. Since 1536=202×7+122=122×8+80×7, scanning is performed 122 times with eight beams, with the remaining 80 scans performed by seven sub-beams SB. In this case, the eighth sub-beam SB is cut off by the shutter 55 after the 122nd scan.

Since, in this example, the device has 16 sub-beams SB, as well as scanning and crystallizing one glass substrate 12 with eight sub-beams SB, scanning and crystallization of the adjacent glass substrate 12 on the mother glass 26 (FIG. 3) can be performed by the remaining eight sub-beams SB. However, in order to do this, it is preferable that the distance between the end of the pixels of the current glass substrate 12 and the nearest end of the pixels of the adjacent glass substrate 12 be an integral multiple of the pixel pitch. Alternatively, the positions of the pixels 22 of all of the glass substrates 12 on the mother glass 26 are preferably arranged on a mesh having a uniform pixel pitch.

FIG. 14 is a view showing the relationship between two glass substrates 12a and 12b on the mother glass 26 and a plurality of sub-beams SB8 and SB9. Sub-beam SB8 is the eighth sub-beam SB among eight sub-beams SB for crystallizing the glass substrate 12a, and sub-beam SB9 is the first sub-beam SB among eight sub-beams SB for crystallizing the glass substrate 12b.

When the eighth sub-beam SB8 has finished 122 scans, it is stopped by the shutter 56. The length of the scan region of the remaining 80 scans which the eighth sub-beam SB8 is capable of scanning is 148.5 µm×80=11.880 mm. If this distance is the same as the distance between the last pixel of the glass substrate 12a and the first pixel of the adjacent glass substrate 12b, the ninth to sixteenth sub-beams SB can be used to crystallize the adjacent glass substrate 12b without wastage. In other words, when the first sub-beam SB scans the first pixels of the glass substrate 12a, the ninth sub-beam SB scans the first pixels of the glass substrate 12b. Where the peripheral region 20 of 2 mm of the glass substrate 12 exists, the gap (L) of (11.880−2×2=7.88 mm) can be provided between the two glass substrates 12a and 12b.

In the present apparatus, as the movable region of ±4 mm relative to the average position is provided for each sub-beam SB, irregularities that can be canceled by this movable range can be accommodated, but the need of adjustment relative to the adjacent glass substrate one by one is complicated, and this process is time-consuming, so it is preferable for the positions of the pixels of all of the panels of the mother glass substrate to be arranged on a mesh having a uniform pixel pitch.

FIG. 14 shows an imaginary mesh M at the pixel pitch of the pixels on the mother glass. Designing the mother glass so that the arrangement of the pixels on the plurality of glass substrates 12a and 12b is the same as the imaginary mesh M, which is drawn with the pixel pitch of the mother glass, is preferred.

Stopping this type of single sub-beam SB temporarily occurs due to its relationship to the pixel pitch, the size of the glass substrates 12, the average positions of the sub-beams SB, and the number of sub-beams SB. In the case of a large glass substrate 12, it should be clear that 16 sub-beams SB can be used more effectively.

FIG. 15 is a view showing an example of the arrangement of the sub-beams SB. To increase effectiveness, it is preferable to reduce the pitch between sub-beams SB. However, because of the limit to which the lenses and mirrors can be miniaturized, there is a limit to which the pitch of the sub-beams SB can be reduced. Under this limitation, in order to reduce the pitch, the sub-beam SB irradiating system can be arranged in not one row, but a plurality of rows as shown in FIG. 15, at the same intervals but staggered. Arranging the system in a plurality of rows in this manner, the distance at which the XY stage can move at a uniform high speed increases at the same rate that the number of rows increases over the width of the mother glass, therefore throughput decreases somewhat.

Figure 16:
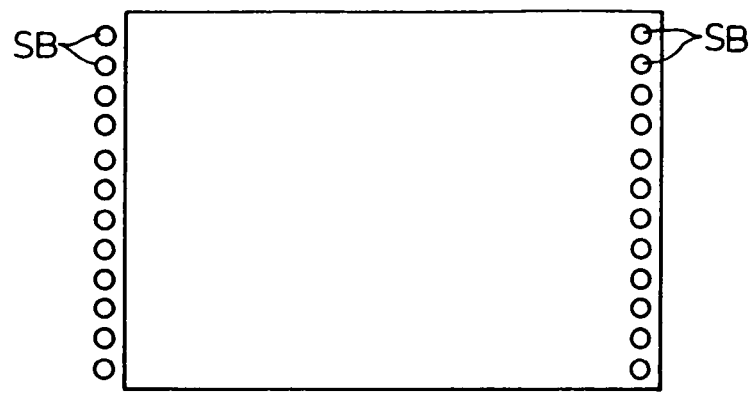
FIG. 16 is a view showing an example of an arrangement of sub-beams.

FIG. 16 is a view showing an example of the sub-beam SB arrangement. In overcoming this problem in two rows, although arranging the sub-beam irradiating system of the two rows by displacing the positions of both sub-beams SB is the same, this can also be achieved by arranging each row in the foremost position of the mother glass when the stage has finished moving at a uniform high speed, as shown in FIG. 16. Naturally, the sub-beam irradiating systems of a plurality of rows can also be arranged at these positions.

Figure 17:
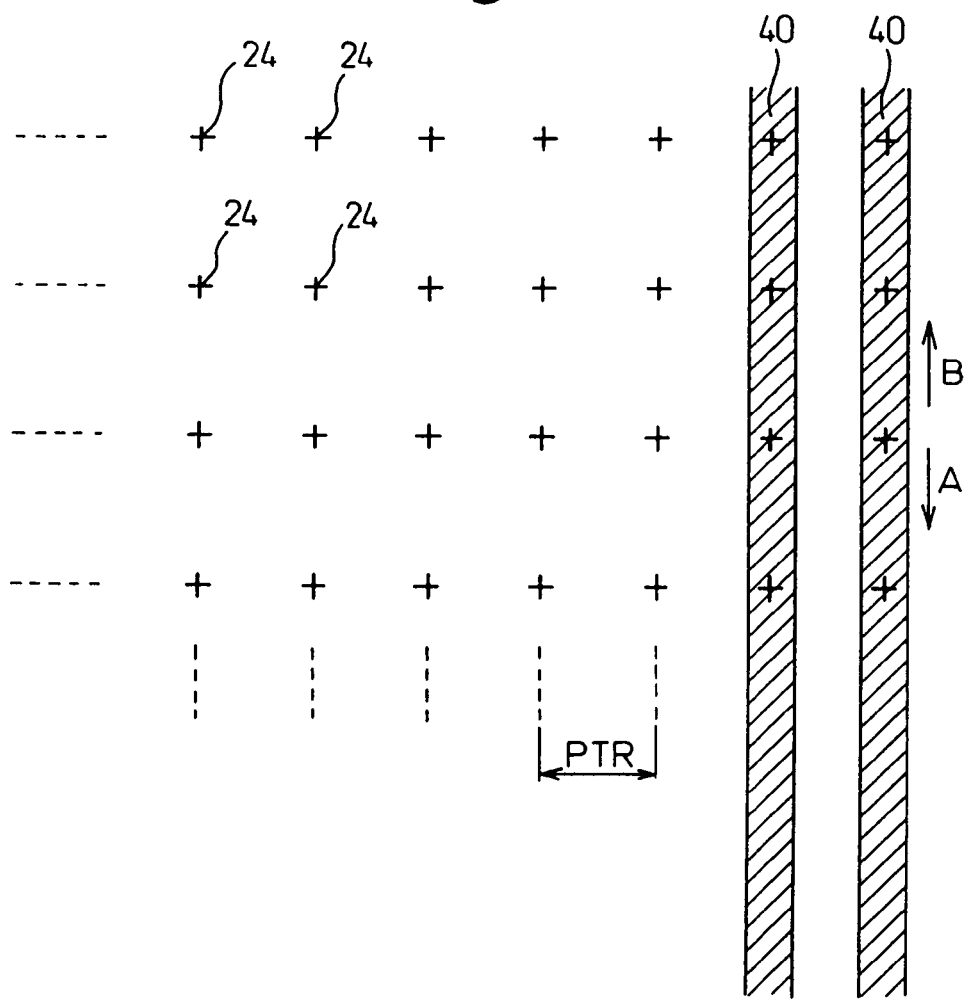
FIG. 17 is a view showing a TFT arrangement and laser scanning in order to explain the principle of the present invention.
Figure 18:
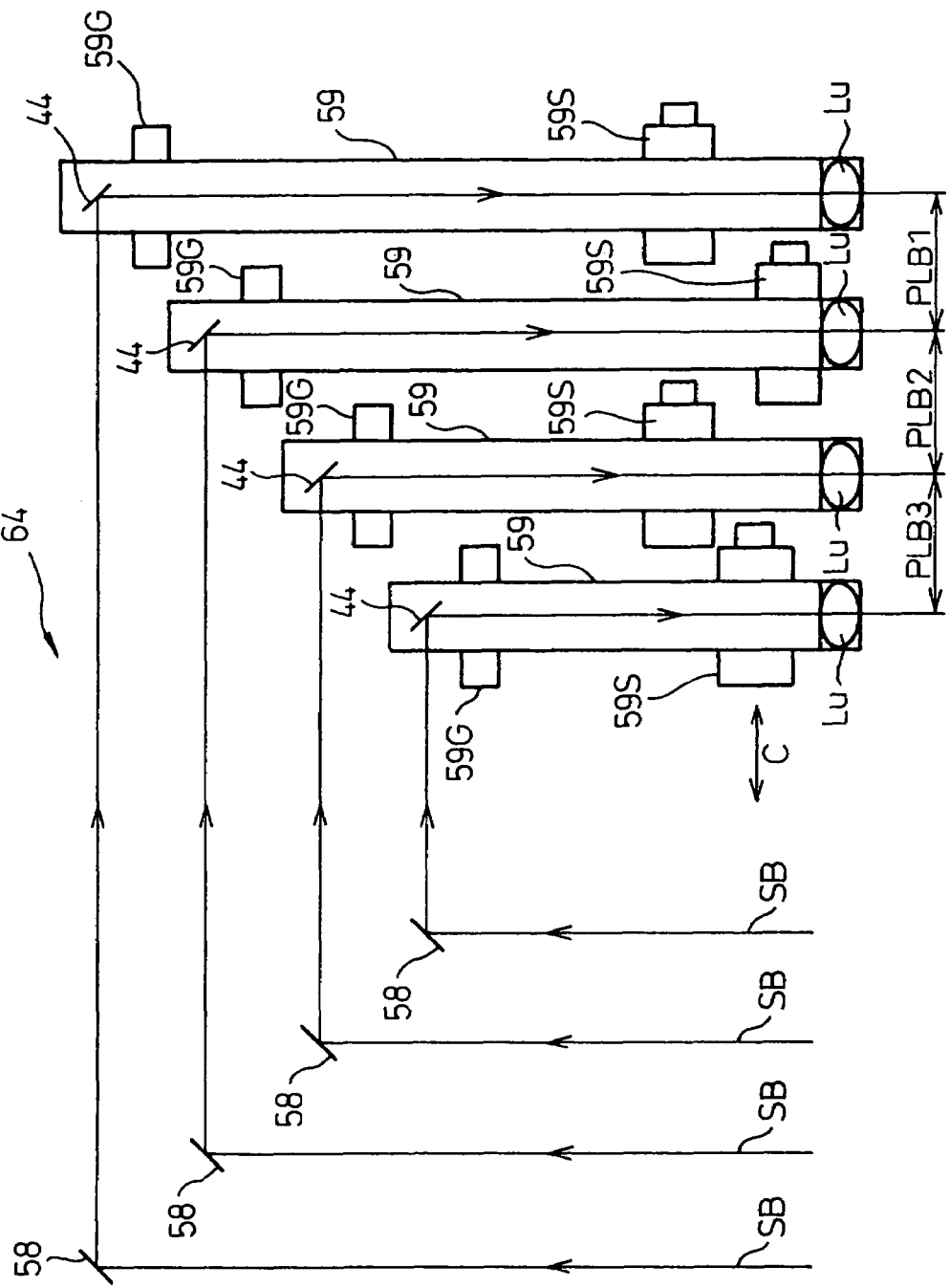
FIG. 18 is a view showing a modified example of the sub-beam assembly of FIGS. 8 to 12.
Figure 19:
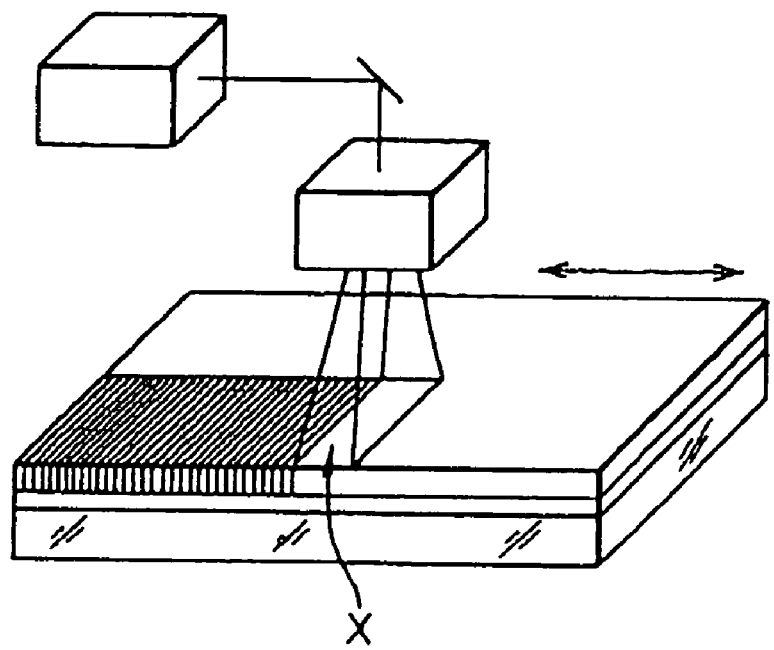
FIG. 19 is a view illustrating a prior art crystallizing method with an excimer pulse laser.
Figure 20:
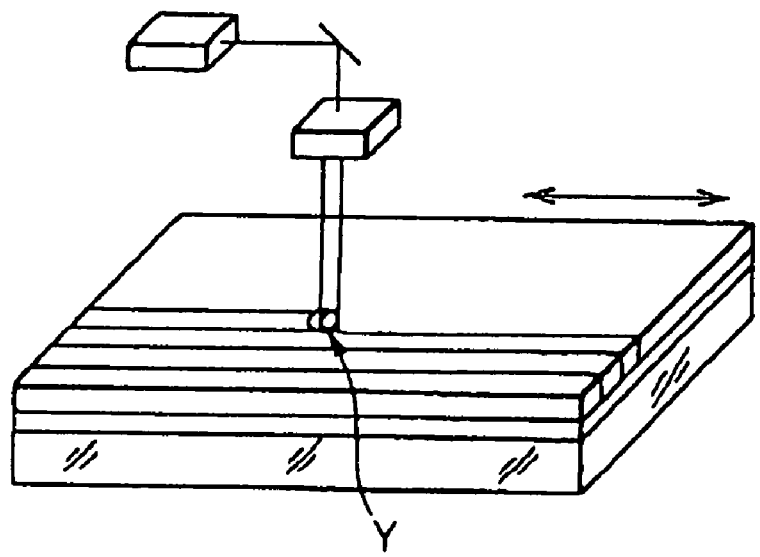
FIG. 20 is a view illustrating a prior art crystallizing method with a CW laser.

FIG. 17 is a view explaining the principle of the present invention. FIG. 18 is a view showing modified example of the sub-beam focussing assembly of FIGS. 8 to 12.

When annealing the panel surface of the amorphous silicon panel by laser, if the entire panel surface is annealed all over, too much time is required. If the TFTs 24 are sporadically scattered as in FIG. 17, it is permissible to anneal only the stripe portions 40 that include the TFTs 24, and there is no need to anneal the entire surface.

In scanning to anneal the panel surface by laser beam, there are a method of moving the laser beams (sub-beams) while the panel is fixed, and a method of moving the panel while the laser beams (sub-beams) are fixed. The present invention can be applied to either method.

As the laser annealing with a single laser beam takes too much time, it is desired to increase the number (n) of the laser beams, so that "n" laser beams lead to 1/n time, and therefore a plurality of laser beams (n beams) are used. As shown in FIG. 17, the TFTs 24 are regularly arranged at pitch PTR, but this pitch PTR varies according to the products. The apparatus of the present embodiment can be adapted for different pitches.

This is illustrated further in FIG. 18. Where annealing with a plurality (four in FIG. 18) of laser beams (sub-beams SB), the panel must be irradiated with sub-beams SB at equal intervals. This mechanism will be explained using the four beam example of FIG. 18.

The four sub-beams SB are turned 90 degrees using optical path conversion mirrors 58, so that the sub-beams SB run parallel to the direction of movement C of the stage shown in the drawing (left-right movement in FIG. 18). Next, the sub-beams SB are turned 90 degrees using optical path conversion mirrors 44, so that the sub-beams SB pass through the exact center of the lens units LU shown in the drawing (lenses 46, 48 and 50 in FIG. 7). The mirrors 44 and lens units LU are located in the focussing units 59. The focussing unit 59 is mounted on the guide 59G (manual stage) and the electrically driven stage 59S, so that when the electrically driven stage 59S moves (left-right movement in the drawing), the entire focussing unit 59 moves left or right. When the electrically driven stage 59S moves (left-right movement in the drawing), the entire focussing unit 59 moves left or right, so that the laser beam (sub-beam SB) always passes through the exact center of the lens unit LU.

With this mechanism, the interval between the outgoing laser beam passing through the lens unit LU and the next outgoing laser beam passing through the next lens unit LU (laser beam pitch PLB1) can be adjusted. The interval between other laser beams can be similarly adjusted using the same method as for the laser beam pitch PLB1.

Next, the method of annealing the panel surface having TFTs at the transistor pitch PTR as shown in FIG. 17 with a plurality of (four in FIG. 18) laser beams (sub-beams SB) having the structure of FIG. 18, without waste or loss will be described.

The transistor pitch PTR is usually in the order of 100 μm (this differs according to the product being produced, as already been described). For example, the case where the PTR is 90 μm and the initial laser beam pitch is 20 mm will be specifically described. As 20 mm/90 μm=222.22 . . . , the integer 222 is attained by rounding off. 222×90 μm=19.98. Thus, if the laser beam pitches PLB1 to PLB4 are made 19.98 mm, four transistor rows with a laser pitch of 19.98 mm can be annealed in one scan. Next, after moving the panel with respect to the laser beam group 90 μm perpendicularly to the laser scanning direction, and again performing a laser scan, the next four transistor rows can be annealed. When laser scanning is thereafter performed another 220 times (scanning has already been performed twice, thus the total number of scans is 222), 222×4 transistor rows are annealed without duplication or loss. A region of 222×4×90 μm=19.98 mm×4=approximately 80 mm can be annealed without waste or failure. Next, after moving the panel with respect to the laser beam group 80 mm perpendicularly to the laser scanning direction, if annealing is performed by the same procedure, a panel of any size can be annealed without duplication or loss.

The present embodiment provides a means for annealing without waste or loss even when laser annealing a panel having a variety of transistor pitches, by setting the laser beam pitch at an integral multiple of the transistor pitch with a structure that can adjust the laser beam pitch. A system of using a plurality of laser beams when laser annealing an amorphous silicon panel or the like using a laser has already been proposed. The present embodiment provides a method that can anneal using a plurality of laser beams and can respond to transistor pitches that vary according to the product and are scattered on the surface of the panel, and by arranging the interval between a plurality of laser beams at an integral multiple of the transistor pitch, provides a means that can anneal effectively and without waste.

As explained above, according to the present invention, throughput can be increased even when using a CW solid laser.

Next, a further embodiment of the present invention will be explained. This embodiment includes the fundamental features described with reference to FIGS. 1 to 4.

Figure 21:
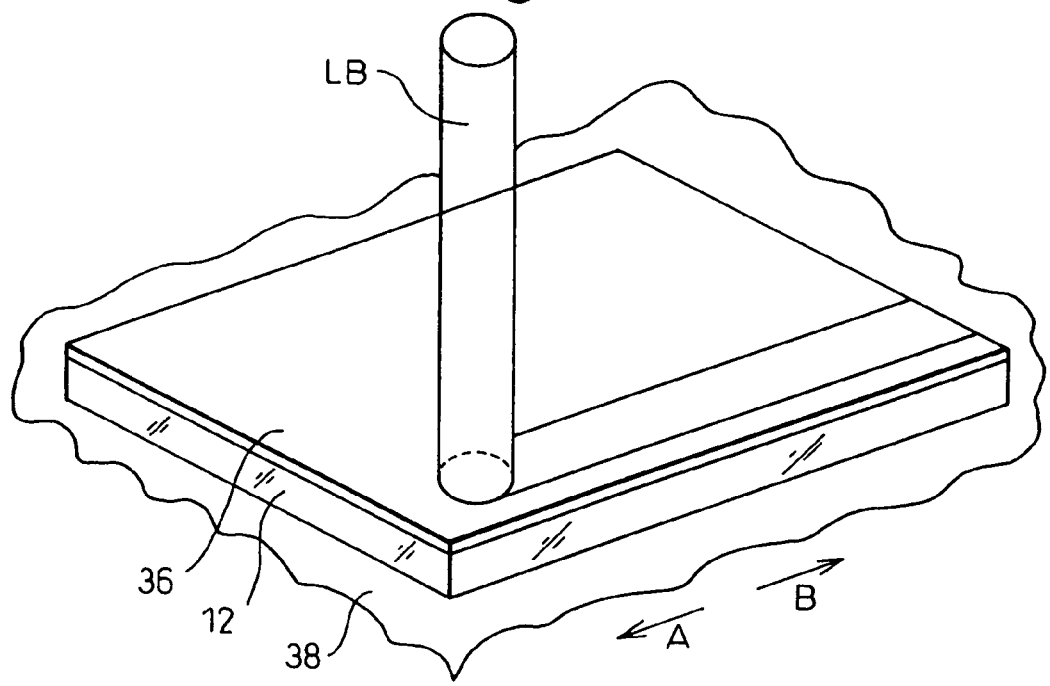
FIG. 21 is a perspective view showing a step of crystallizing a semiconductor layer by means of a laser beam according to a further embodiment of the present invention.

FIG. 21 is a view showing a step of crystallizing an amorphous silicon layer (semiconductor layer) by means of a laser beam. The amorphous silicon layer 36 is formed on a glass substrate 12 with an insulating layer of $SiO_2$ or the like arranged therebetween, and the glass substrate 12 is fixed to an XY stage 38 by a vacuum chuck or a mechanical stopper of the stage 38. A laser beam LB is irradiated onto the amorphous silicon layer 36, and the XY stage 38 is moved in a predetermined direction, so that scanning is performed. Initially, the laser beam is focussed and irradiated onto the amorphous silicon layer 36 of the peripheral region 20 of the glass substrate 12, to melt and harden the amorphous silicon layer to crystallize the amorphous silicon layer into polysilicon. Then, the laser beam is focussed and irradiated onto the amorphous silicon layer 36 of the display region 18 of the glass substrate 12, to melt and harden the amorphous silicon layer to crystallize the amorphous order of operation silicon layer into polysilicon. The reason for this is that, in the case where the laser scanning is performed in an intersecting manner, the crystallinity of the intersecting portions when crystallization is performed firstly with a strong laser light corresponding to that as for the peripheral region and then with a weak laser light corresponding to that for the display region is identical to the crystallinity of the peripheral region when the strong laser light is used, but the crystallization by the strong laser light is insufficient if the laser light is irradiated in the reverse order. This is because light absorption is less if the amorphous silicon is partially crystallized to a certain degree.

As the TFTs of the peripheral region 20 are arranged more densely than the TFTs 24 of the display region 18, high quality polysilicon is required. Consequently, laser scanning of the peripheral region 20 is performed with a laser beam of relatively high power at a relatively low scanning speed and, as the TFTs 24 of the display region 18 do not require polysilicon of a higher quality, scanning is performed with a relatively low power laser beam (or by sub-beams divided from the laser beam) at a relatively high scanning speed.

Figure 22:
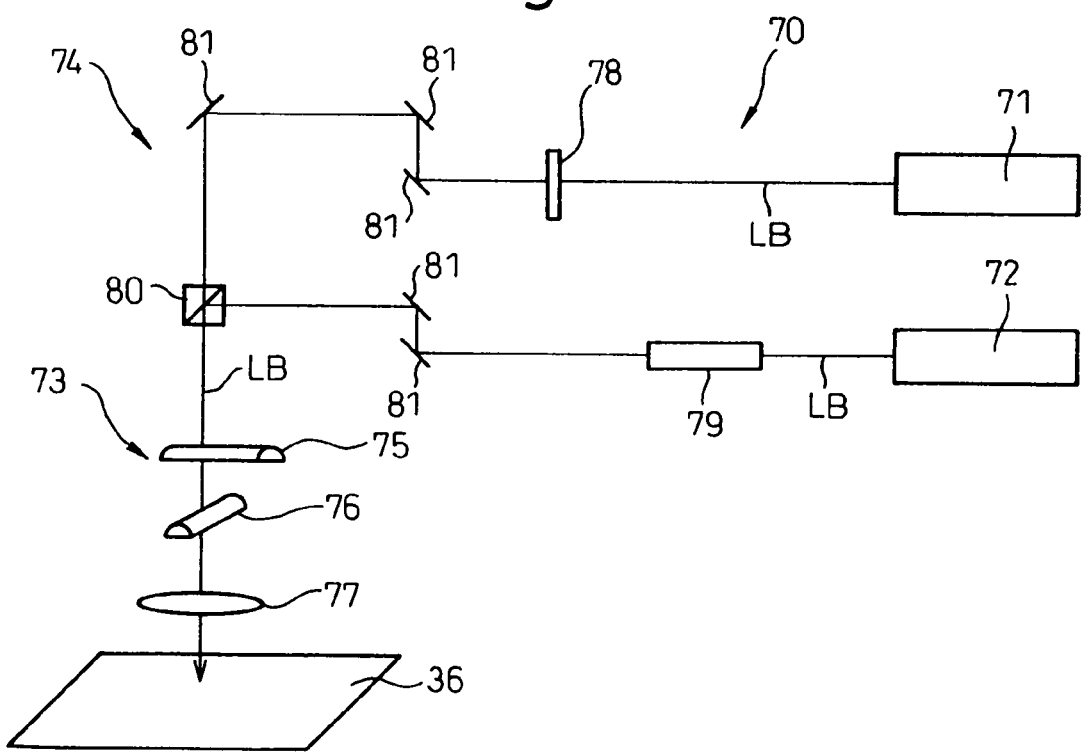
FIG. 22 is a view showing a laser device used in crystallizing the semiconductor of the peripheral region.

FIG. 22 is a view showing a laser device 70 used for crystallizing the semiconductor of peripheral region 20. The laser device 70 is used with the XY stage 38 of FIG. 5 for crystallization. The laser device 70 comprises two laser sources (continuous wave (CW) laser oscillators) 71 and 72, a common focussing optical system 73, and a combining optical system 74 for guiding laser beams LB outgoing from the two laser sources 71 and 72 to the focussing optical system 73.

The focussing optical system 73 comprises a substantially semicircular cylindrical lens 75, a substantially semicircular cylindrical lens 76 arranged perpendicular to the lens 75, and a convex lens 77. The beam spots of the laser beams LB are formed in the elliptical shape by the focussing optical system 73.

The combining optical system 74 comprises a λ/2 plate 78 disposed after the first laser source 71, a beam expander 79 disposed after the second laser source 72, and a polarizing beam splitter 80 for combining outgoing laser beams LB from the first and second laser sources 71 and 72. Numeral 81 denotes a mirror.

The laser beams LB outgoing from the laser sources 71 and 72 are combined by the combining optical system 74, and are irradiated onto the amorphous semiconductor 36 of the glass substrate 12 through the focussing optical system 73 to crystallize the amorphous semiconductor 36. The beam expander 79 adjusts the diverging angle of the laser beam LB. In other words, if there is a deviation between the diverging angles of the laser beams LB, there is a case where one laser beam LB is focussed by the focussing optical system 73 but the focus of the other laser beam LB may not match, and therefore, it is intended that the focusses of the two laser beams LB are matched, by adjusting the diverging angle of the laser beam LB by means of the beam expander 79. The beam expander 79 may also be arranged in the optical path of the other laser beam LB. Also, two beam expanders can be arranged in both the optical paths of the laser beams LB.

The laser beams LB emitted by the first and second laser sources 71 and 72 are vertically linearly polarized, and the laser beam LB emitted by the first laser source 71 has its plane of polarization rotated 90 degrees by the $\lambda/2$ plate 78 and is horizontally linearly polarized. Consequently, the laser beam LB output from the first laser source 71 and passing through the $\lambda/2$ plate 78, and the laser beam LB output from the second laser source 72 are guided into the polarizing beam splitter 80, and the two laser beams LB are directed to the amorphous semiconductor 36 in a substantially superposed manner. The change in the state of linear polarization is illustrated in more detail in FIG. 23.

Figure 24:
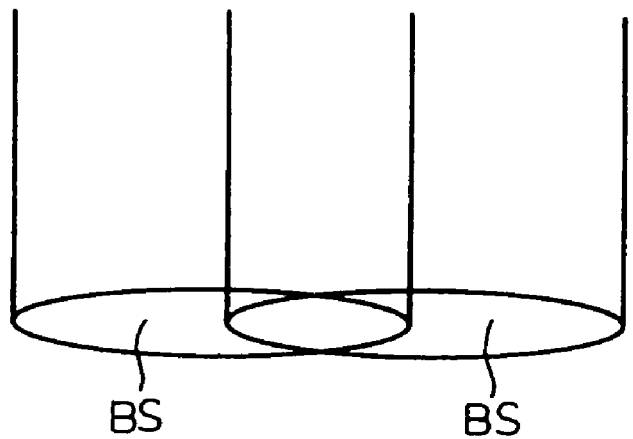
FIG. 24 is a view showing an example of beam spots.

Each laser beam LB passes through the focus optical system 73 to form an elliptical beam spot. As shown in FIG. 24, the individual beam spots of the laser beams LB are superposed, and the beam spots of the combined laser beams LB form a cocoon shaped beam spot BS. This can be achieved by slightly displacing the angle of any one of the mirrors 81, for example. In other words, the laser beams LB outgoing from the of laser sources 71 and 72 form elliptical beam spots, respectively, and the elliptical beam spots mutually overlap in the direction of their long axes.

In this example, the $SiO_2$ layer is formed at the thickness of 400 nm on the glass substrate 12 by plasma CVD, and the amorphous silicon 36 is formed thereon by plasma CVD to a thickness of 100 nm. The laser used is a continuous wave Nd:YV04 solid laser. In one example, where a single laser source is used, a 400 μm×20 μm beam spot is formed at the laser power of 10 W. If scanning is performed using a single laser, with a laser width of 400 μm and a scan speed of 50 cm/s, the area scan speed of 200 $cm^2$/s can be achieved. Also, within the laser irradiation width of 400 μm, the 150 μm wide stripe portion of the amorphous semiconductor 36 is well melted and crystallized, and exhibits a flow type grain boundary. Once the TFTs are formed in the polysilicon region made from this flow type grain boundary, a high mobility characteristic of 500($cm^2$/Vs) can be attained.

The combined beam spot of the laser beams outgoing from the two laser sources 71 and 72, as shown in FIG. 22, is 600 μm×20 μm. When the laser scan is performed at the laser power of 10 W and the spot width of 600 μm, scan speed of 50 cm/s, the 350 μm wide stripe portion of the amorphous semiconductor 36 is particularly well melted and crystallized within the laser irradiation width of 600 μm, and attains a flow type grain boundary. The high quality crystallized stripe portion with a width of 350 μm is twice the width of the high quality crystallized stripe portion with a width of 150 μm using a single laser. In other words, by means of the compound heating of the two beam spots, the beam spot size and effective melt width (high quality crystallization width) can be enlarged.

Figure 23:
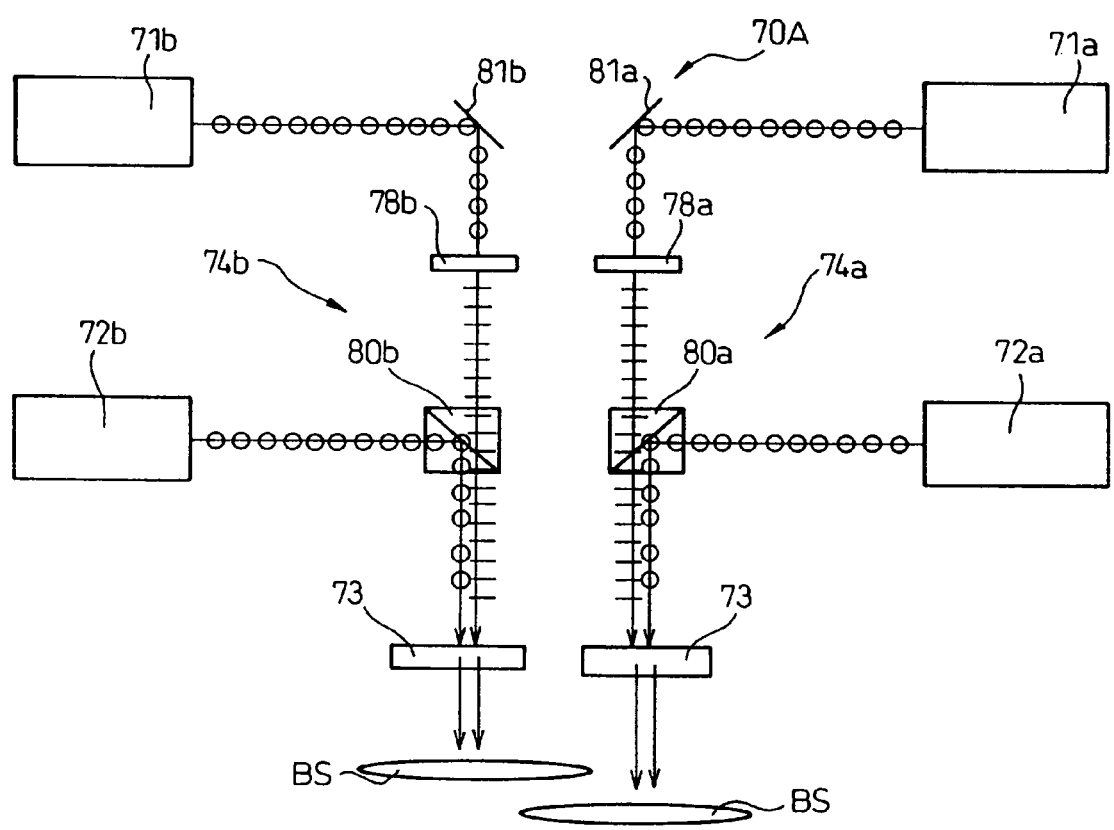
FIG. 23 is view showing a modified example of the laser device.

FIG. 23 is view showing a modified example of the laser device 70. The laser device 70A of FIG. 23 includes two units of optical system. Each unit of optical system includes the same components as those of the laser device 70 of FIG. 22. The optical system of the first unit uses the same numbers as FIG. 22 to indicate the same optical components, with the subscript "a" attached, while the optical system of the second unit uses the same numbers as FIG. 22 to indicate the same optical components, with the subscript "b" attached. The beam expander 79 can be provided as appropriate.

The optical systems of the two units are arranged in close proximity, and the beam spots BS created by the optical systems of the two units are arranged so that they are shifted in both the direction perpendicular to and the direction parallel to the scanning direction. In this structure, each of 350 μm effective melt width regions is arranged so that the scan track overlaps by 50 μm and the effective melt width is 650 μm.

Figure 25:
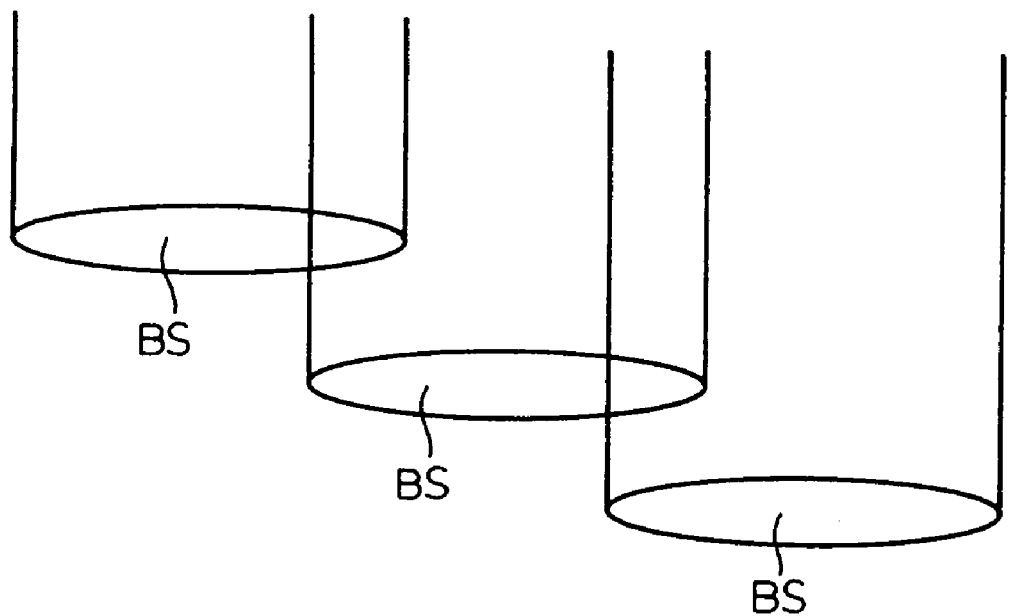
FIG. 25 is a view showing an example of beam spots.

FIG. 25 is a view showing another example of beam spots. Three beam spots BS are arranged so that they are shifted in both the direction perpendicular to, and the direction parallel to, the scanning direction. The three beam spots are all irradiated onto the substrate, while shifted in the scanning direction and without overlapping. However, the three beam spots are arranged such that they scan the semiconductor layer in parallel and overlap with each other when seen in the scanning direction so that their melt widths overlap each other. Also, more than three beam spots can be arranged so that they are shifted in both the direction perpendicular to, and the direction parallel to, the scanning direction.

As explained above, according to the present invention, throughput can be increased even when using a CW fixed laser.

Figure 26:
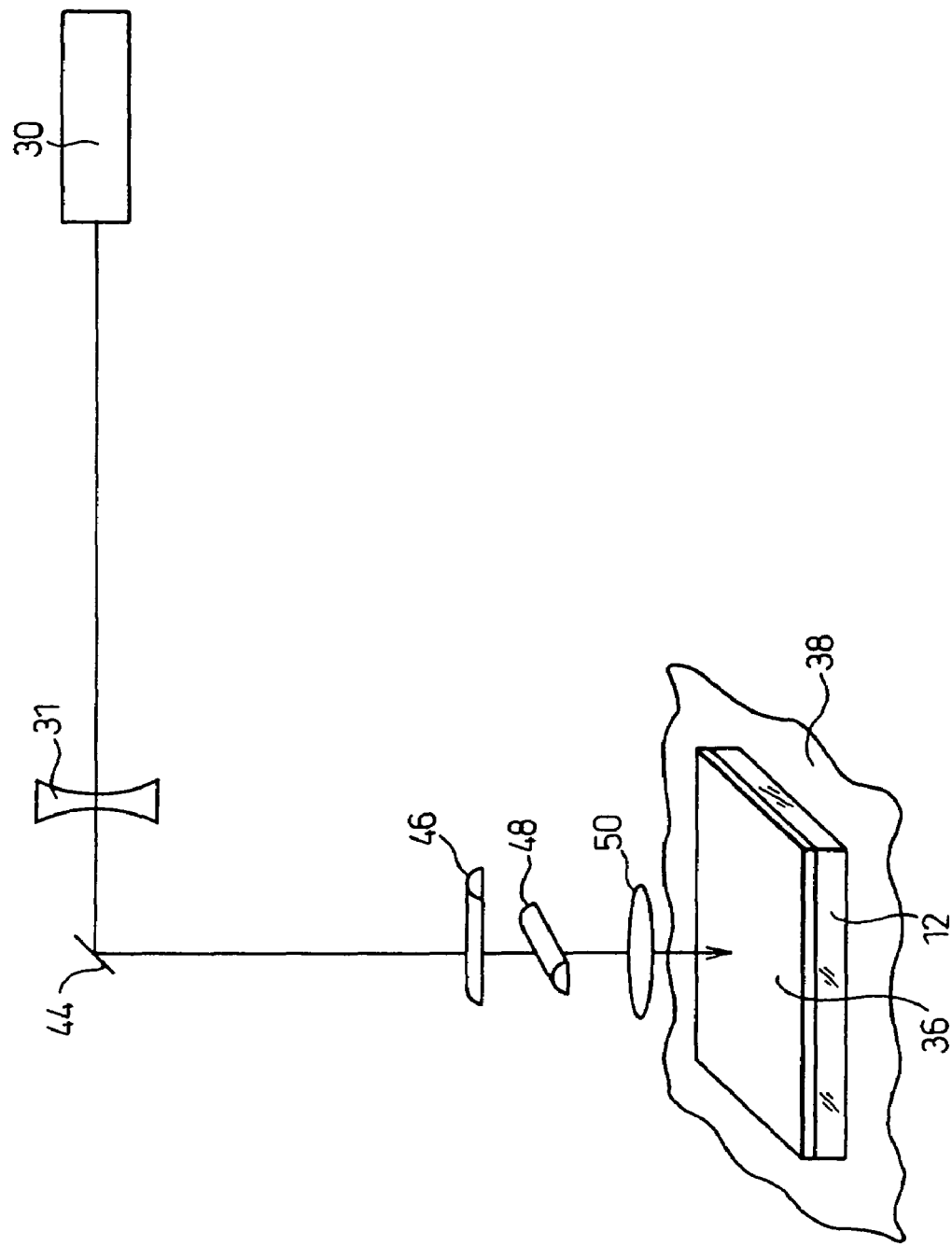
FIG. 26 is a view showing a step of crystallizing a semiconductor layer by means of a laser beam according to a further embodiment of the present invention.

Next, a further embodiment of the present invention will be explained. This embodiment includes the fundamental features described with reference to FIGS. 1 to 4. FIG. 26 is a view showing a step of crystallizing an amorphous silicon layer (semiconductor layer) 36 by means of a laser beam. The amorphous silicon layer 36 is formed on a glass substrate 12, with an insulating layer of $SiO_2$ or the like therebetween, and the glass substrate 12 is fixed to a movable stage 38 by a vacuum chuck or a mechanical stopper of the stage. A laser beam LB output from a laser source (continuous wave (CW) laser oscillator) 30 passes through a concave lens 31, is reflected by a mirror 44, passes through a focussing optical system, and is irradiated onto the amorphous silicon layer 36. The focussing optical system comprises a substantially semicircular cylindrical lens 46, a substantially semicircular cylindrical lens 48 arranged perpendicular to the lens 46, and a convex lens 50. The beam spot of the laser beam LB passing through the convex lens 50 is formed into an elliptical shape.

The laser beam LB is irradiated onto the amorphous silicon layer 36, and the movable stage 38 is moved in a predetermined direction, so that the laser scanning is performed. Firstly, the laser beam LB is focussed and irradiated onto the amorphous silicon 36 of the peripheral region 20 of the glass substrate 12, to melt and harden the amorphous silicon to crystallize into polysilicon. Then, the laser beam is focussed and irradiated onto the amorphous silicon 36 of the display region 18 of the glass substrate 12 to melt and harden the amorphous silicon to crystallize it into polysilicon.

As the TFTs of the peripheral region 20 are arranged more densely than the TFTs 24 of the display region 18, high quality polysilicon is required. Consequently, laser scanning of the peripheral region 20 is performed with a laser beam of relatively high power at a relatively low scanning speed and, as the TFTs 24 of the display region 18 do not require polysilicon of a higher quality, scanning is performed with a relatively low power laser beam (or by sub-beams divided from the laser beam) at a relatively high scanning speed.

Figure 27:
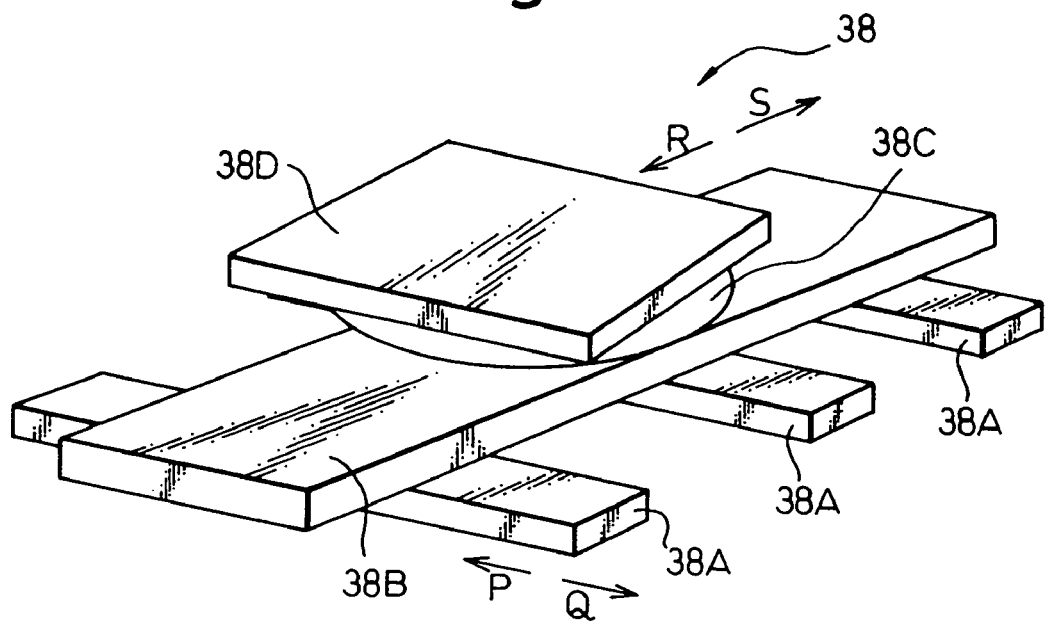
FIG. 27 is a perspective view showing a movable stage supporting a glass substrate having an amorphous silicon layer thereon.

FIG. 27 is a perspective view showing the movable stage 38 supporting the glass substrate 12 having the amorphous silicon layer 36. The movable stage 38 comprises first stage members 38A arranged in parallel and moves in a first direction P, Q synchronously, a second stage member 38B disposed above the first stage members 38A and moves in a second direction R, S perpendicular to the first direction, and a third stage member 38C rotatably disposed above the second stage 38B. The third stage member 38C has a vacuum chuck 38D for securing the amorphous semiconductor 36 of the glass substrate 12. The third stage member 38C (the rotatable stage) can rotate within the angular range of 110 degrees. In the movable stage 38, the first stage members 38A are disposed at the lowermost position and support the second stage member 38B and the third stage member 38C. The second stage member 38B is large and long, has a greater stroke, and can move at high speed. Consequently, the second stage member 38B which is movable at high speed is not required to support the first stage members 38A, and therefore the load on the second stage member 38B is small. The first stage members 38A move simultaneously and support the second stage member 38B without bending. Accordingly, the second stage member 38B can be driven at a higher speed, by which the throughput of crystallization can be improved.

Figure 28:
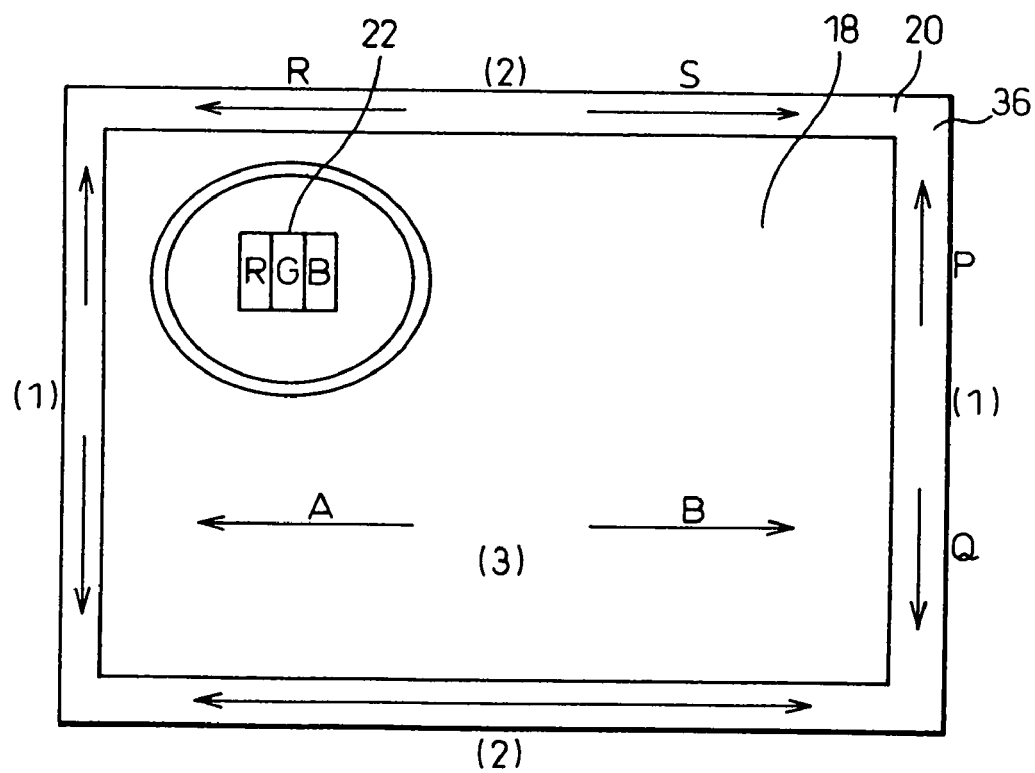
FIG. 28 is a view showing the operation of a laser scan.
Figure 29:
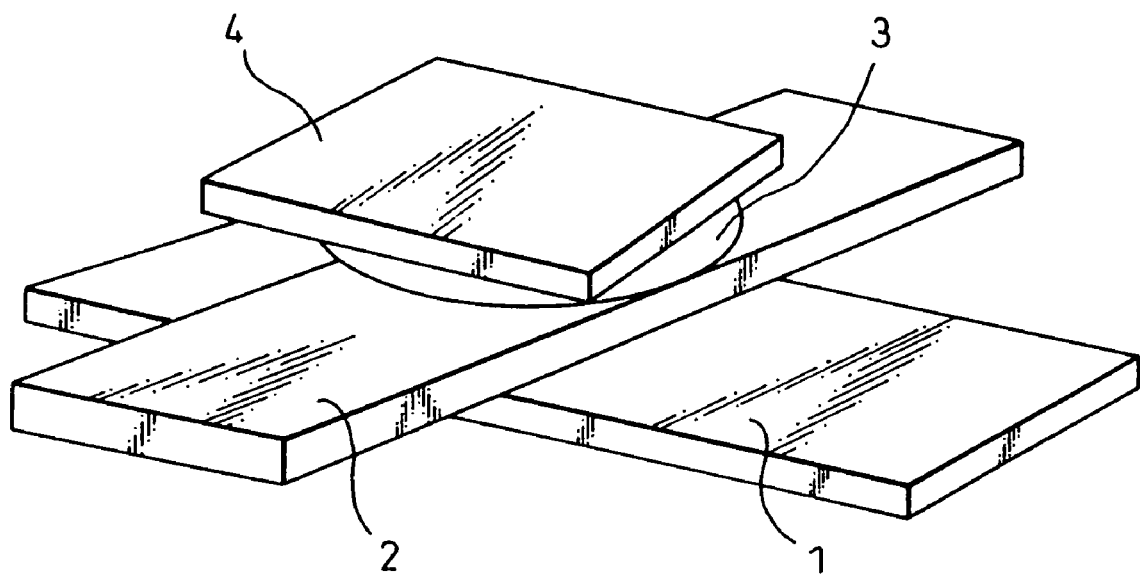
FIG. 29 is a perspective view showing a prior art movable stage.

FIG. 28 is a view showing a laser scanning operation. Firstly, laser scanning of the peripheral region 20 is performed. In the laser scanning of the peripheral region 20, (1) crystallization of the areas of the peripheral region 20 running parallel to the first scanning direction P, Q is performed, (2) next, after the third stage member 38C (the rotatable stage) supporting the glass substrate 12 is rotated 90 degrees, crystallization of the areas of the peripheral region 20 running parallel to the second scanning direction R, S perpendicular to the first scanning direction P, Q is performed. Then, (3) the display region 18 is crystallized in a third scanning direction A, B parallel to the direction in which sub-pixel regions of the three basic colors of the pixels 22 are arranged.

The reason for this order of operation is that, in the case where the crystallizing scanning is performed over a plurality of panels and scanning intersecting portions occur, the crystallinity of the intersecting portions when crystallization is performed firstly with a high energy density laser light of the peripheral region and then with a weak laser light corresponding to that of the display region is identical to that when the crystallization is performed with a strong laser light, but the crystallization by the strong laser light is insufficient if the laser light is irradiated in the reverse order. This is because the absorption of light is less if the amorphous silicon is partially crystallized to a certain degree, compared to the amorphous state. An additional reason for performing the operation in the order is that scanning in the same direction can be continued.

That is, initially, laser scanning of two shorter sides among four sides of the peripheral region 20 of the glass substrate 12 is performed, then laser scanning of two longer sides among four sides of the peripheral region 20 of the glass substrate 12 is performed. In the scanning of the two shorter sides, the shorter sides of the glass substrate 12 are positioned perpendicular to the second stage member 38B, and the second stage member 38B is reciprocally moved in the first scanning direction P, Q together with the glass substrate 12. The second stage member 38B is driven so as to move in one direction P, and while this movement, the second stage member 38B is accelerated from a stationary position, laser scanning is performed with the second stage member 38B in a constant speed state, and the second stage member 38B is decelerated and stopped after it has passed the laser scanning region. Then, after the first stage members 38A is moved a minute amount in the direction perpendicular to the first scanning direction P, Q, the second stage member 38B is driven so as to move in the opposite direction Q. At that time, the second stage member 38B is accelerated, moves at a constant speed, and is decelerated. While repeating this reciprocal movement, laser scanning is performed so that the end portions of the irradiated regions overlap each other.

Subsequently, the third stage member 38C (rotatable stage) is rotated 90 degrees and the long sides of the glass substrate 12 are positioned parallel to the second stage member 38B. Laser scanning of the two long sides is performed in the second scanning direction R, S. Scanning of the two long sides is performed while repeating the reciprocal movement in the same manner as for the short sides.

After this, laser scanning of the display region 18 is performed in the third scanning direction A, B. As the third scanning direction A, B is parallel to the second scanning direction R, S, the third stage member 38C (rotatable stage) is supported in the same rotational position as that when the two long sides of the peripheral region 20 are scanned. After the first stage members 38A are moved to initial positions in the direction perpendicular to the second scanning direction R, S, the second stage member 38B is driven so as to move reciprocally in the third scanning direction A, B.

Between reciprocal movements of the second stage member 38B, the first stage members 38A are moved by a minute amount in the direction perpendicular to the second scanning direction R, S. The amount of movement of the first stage members 38A during laser scanning of the display region 18 is greater than the amount of movement of the first stage members 38A during laser scanning of the peripheral region 20. In other words, laser scanning of the display region 18 is performed at a larger pitch than that of laser scanning of the peripheral region 20. Also, laser scanning of the display region 18 is performed at a higher scanning speed than laser scanning for the peripheral region 20. Further, laser scanning of the display region 18 is performed at a lower laser power than laser scanning of the peripheral region 20. Further still, the number of scans when crystallization of the display region 18 is performed in the third scanning direction A, B, parallel to the direction in which the three primary color sub-pixel regions of the pixels 22 are arranged, is significantly less than the number of scans when crystallization of the display region 18 is performed in a direction perpendicular to the direction in which the three primary color sub-pixel regions of the pixels 22 are arranged (perpendicular to the direction A, B), therefore the laser scanning time can be shortened.

In this manner, by positioning the high precision first stage members 38A at the bottom, and positioning the high speed second stage member 38B thereabove, the weight of the load on the high speed second stage member 38B can be reduced. Simultaneously, the long second stage member 38B can be supported by the plurality of first stage members 38A so that the second stage member 38B can be supported without bending. The plurality of first stage members 38A are driven in synchronization. Thus, when the high speed second stage member 38B is accelerated and decelerated the acceleration can be increased and the time taken for movements other than for laser scanning can be shortened. By enabling the third stage member 38C (rotatable stage) to rotate within the range of 110 degrees, after mounting the glass substrate 12 in the vacuum chuck 38D, crystallization of the peripheral region 20 and crystallization of the display region 18 can be continuously performed. Thus, according to the present invention, the throughput of crystallization can be improved.

In the example, the $SiO_2$ layer is formed at a thickness of 400 nm on the glass substrate 12 by plasma CVD, and the amorphous semiconductor 36 is formed thereon by plasma CVD to a thickness of 100 nm. The laser used is a continuous wave Nd:YV04 solid laser. In one example, the laser is 10 W and forms a 400 μm×20 μm beam spot. If scanning is performed using a single laser source, with a laser width of 400 μm and a scan speed of 50 cm/s, an area scan speed of 200 $cm^2$/s can be achieved. Also, within the laser irradiation width of 400 μm, the 150 μm wide stripe portion of the amorphous semiconductor 36 is well melted and crystallized, and exhibits a flow type grain boundary. Once the TFTs are formed in the polysilicon region made from this flow type grain boundary, a high movement characteristic of 500($cm^2$/Vs) can be attained.

As described above, according to the present invention, throughput can be increased even in a case where a CW fixed laser is used.

The invention claimed is:

1. An apparatus for crystallizing a semiconductor, comprising:
    at least one laser source;
    beam dividing means for dividing a laser beam emitted by the laser source into a plurality of sub-beams;
    at least one focussing optical system for focussing the sub-beams on an amorphous semiconductor on a substrate;
    a moving mechanism for changing a distance between at least two spot positions of the sub-beams formed by the focussing optical system;
    first mirrors for directing the sub-beams to the focussing optical system; and
    second mirrors provided in the focussing optical system to receive the sub- beams reflected by the first mirrors,
    wherein the sub-beams between the first mirrors and the second mirrors are parallel to a direction of movement of the moving mechanism, and
    wherein said focussing optical system includes a frame and a plurality of movable focussing units secured by said frame, and said moving mechanism includes moving members associated with the focussing units for moving said focussing units relative to said frame,
    wherein said focussing units are arranged parallel to each other in a plane and movable to change the distance between sub-beams formed by the adjacent two focussing units,
    wherein each of the focussing units includes a case, a mirror and lenses secured by said case.

2. The apparatus according to claim 1, wherein said at least one laser source comprises a plurality of laser sources, and said beam separating means comprises a plurality of sets of optical members, the number of the sets of optical members corresponding to the number of the laser sources.

3. The apparatus according to claim 2, wherein said at least one of the sets of optical members includes a beam expander for correcting a difference in diverging angles of the laser beams emitted by the laser sources.

4. The apparatus according to claim 3, wherein each of the sets of optical members includes at least one beam splitter and at least one mirror.

* * * * *